(12) United States Patent
Im et al.

(10) Patent No.: US 12,074,152 B2
(45) Date of Patent: Aug. 27, 2024

(54) DISPLAY DEVICE

(71) Applicant: Samsung Display Co., LTD., Yongin-si (KR)

(72) Inventors: Dae Hyuk Im, Hwaseong-si (KR); Sun Oh Jeong, Hwaseong-si (KR); So Young Yeo, Suwon-si (KR); Hee Ju Woo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 120 days.

(21) Appl. No.: 17/410,053

(22) Filed: Aug. 24, 2021

(65) Prior Publication Data
US 2022/0149027 A1    May 12, 2022

(30) Foreign Application Priority Data
Nov. 6, 2020 (KR) .................... 10-2020-0147444

(51) Int. Cl.
*H01L 25/18* (2023.01)
*H01L 21/66* (2006.01)
(Continued)

(52) U.S. Cl.
CPC .............. *H01L 25/18* (2013.01); *H01L 22/32* (2013.01); *H01L 23/49838* (2013.01);
(Continued)

(58) Field of Classification Search
CPC ........... H01L 22/32; H01L 2224/06165; H01L 2224/32227; H01L 2224/8313; H01L 2224/83132; H01L 2224/83851; H01L 2224/83908; H01L 23/49838; H01L 23/4985; H01L 24/06; H01L 24/32; H01L 24/83; H01L 25/18; H01L 2924/14; H05K 1/0268; H05K 1/147; H05K 1/189;
(Continued)

(56) References Cited

U.S. PATENT DOCUMENTS

| 10,042,222 | B2 * | 8/2018 | Wang | .................. H01L 27/1259 |
| 10,321,559 | B2 * | 6/2019 | Meng | ....................... H05K 1/14 |

(Continued)

FOREIGN PATENT DOCUMENTS

| CN | 104678617 A | * | 6/2015 | ........... G02F 1/1362 |
| CN | 104880840 A | * | 9/2015 | ........... G02F 1/1309 |

(Continued)

*Primary Examiner* — Telly D Green
(74) *Attorney, Agent, or Firm* — CANTOR COLBURN LLP

(57) ABSTRACT

A display device includes a display panel, a first film attached to the display panel, an adhesive member interposed between the display panel and the first film and extending in a first direction to attach the display panel to the first film, a first test electrode covered by the adhesive member; a second test electrode covered by the adhesive member and spaced apart from the first test electrode in a second direction perpendicular to the first direction, and test lines comprising a first test line electrically connected to the first test electrode and a second test line electrically connected to the second test electrode, where the adhesive member is disposed between the first test electrode and the second test electrode in the second direction.

17 Claims, 20 Drawing Sheets

US 12,074,152 B2
Page 2

(51) Int. Cl.
*H01L 23/00* (2006.01)
*H01L 23/498* (2006.01)
*H05K 1/02* (2006.01)
*H05K 1/18* (2006.01)

(52) U.S. Cl.
CPC .............. *H01L 24/06* (2013.01); *H01L 24/32* (2013.01); *H01L 24/83* (2013.01); *H05K 1/0268* (2013.01); *H01L 2224/06165* (2013.01); *H01L 2224/32227* (2013.01); *H01L 2224/8313* (2013.01); *H01L 2224/83132* (2013.01); *H01L 2224/83851* (2013.01); *H01L 2224/83908* (2013.01); *H05K 1/189* (2013.01); *H05K 2201/10128* (2013.01); *H05K 2201/10378* (2013.01)

(58) Field of Classification Search
CPC .......... H05K 2201/10128; H05K 2201/10378; H05K 3/323; G09G 3/006
See application file for complete search history.

(56) References Cited

U.S. PATENT DOCUMENTS

| | | | | |
|---|---|---|---|---|
| 10,643,513 | B2 * | 5/2020 | Wang | G09G 3/006 |
| 11,557,640 | B2 * | 1/2023 | Jang | H10K 59/40 |
| 11,605,695 | B2 * | 3/2023 | Kim | G02F 1/136286 |
| 2016/0275836 | A1 * | 9/2016 | Wang | G02F 1/1362 |
| 2016/0370658 | A1 * | 12/2016 | Dong | G02F 1/136286 |
| 2017/0196080 | A1 * | 7/2017 | Meng | H05K 1/14 |
| 2017/0338198 | A1 * | 11/2017 | Jang | H01L 24/27 |
| 2018/0004031 | A1 * | 1/2018 | Kim | C23C 18/28 |
| 2018/0286296 | A1 * | 10/2018 | Wang | G09G 3/006 |
| 2020/0212158 | A1 * | 7/2020 | Shim | H10K 59/131 |
| 2020/0312940 | A1 * | 10/2020 | Jang | H10K 59/40 |
| 2020/0403054 | A1 * | 12/2020 | Jang | H01L 24/29 |
| 2021/0041922 | A1 * | 2/2021 | Jang | H10K 50/8426 |
| 2021/0066443 | A1 * | 3/2021 | Kim | H10K 59/131 |
| 2021/0134929 | A1 * | 5/2021 | Kim | H10K 59/131 |
| 2021/0181889 | A1 * | 6/2021 | Kim | G06F 3/0446 |
| 2021/0288015 | A1 * | 9/2021 | Jang | H05K 3/323 |
| 2021/0375804 | A1 * | 12/2021 | Kang | H01L 24/02 |
| 2021/0376043 | A1 * | 12/2021 | Kang | G09G 3/3225 |

FOREIGN PATENT DOCUMENTS

| | | | | |
|---|---|---|---|---|
| CN | 209103793 | U | * | 7/2019 |
| CN | 111123170 | A | | 5/2020 |
| KR | 0165353 | B1 | | 2/1999 |
| KR | 101321298 | B1 | | 10/2013 |
| KR | 101783953 | B1 | * | 10/2017 |
| KR | 20180001672 | A | * | 1/2018 |
| KR | 20180029169 | A | * | 3/2018 |
| KR | 101876234 | B1 | * | 7/2018 |
| KR | 20190024326 | A | * | 3/2019 |
| WO | WO-2016112594 | A1 | * | 7/2016 ....... G02F 1/133345 |

* cited by examiner

100: SUB1, ATL, SL, SUB2

DISPLAY DEVICE

This application claims priority to Korean Patent Application No. 10-2020-0147444, filed on Nov. 6, 2020, and all the benefits accruing therefrom under 35 U.S.C. 119, the content of which in its entirety is herein incorporated by reference.

BACKGROUND

1. Field

The disclosure relates to a display device, and a method of fabricating the display device.

2. Description of the Related Art

Electronic devices that provide images to a user, such as a smart phone, a tablet personal computer ("PC"), a digital camera, a laptop computer, a navigation device and a smart television ("TV"), may include a display device for displaying images.

A display device includes a plurality of pads and alignment marks. A flexible film, e.g., a chip-on-film ("COF") having a driving circuit and the like mounted thereon is typically coupled to the plurality of pads, to transmit driving signals to pixels. The alignment marks may be used to align the substrate of the display device with the flexible film.

The flexible film may include a plurality of leads coupled to the plurality of pads. The leads may be bonded to the pads separated from one another.

SUMMARY

Embodiments of the disclosure provide a display device that can measure an insulation resistance and an insulation gap, and a method for manufacturing a display device.

An embodiment of a display device includes a display panel, a first film attached to the display panel, an adhesive member interposed between the display panel and the first film and extending in a first direction to attach the display panel to the first film, a first test electrode covered by the adhesive member: a second test electrode covered by the adhesive member and spaced apart from the first test electrode in a second direction perpendicular to the first direction, and test lines comprising a first test line electrically connected to the first test electrode and a second test line electrically connected to the second test electrode, where the adhesive member is disposed between the first test electrode and the second test electrode in the second direction.

An embodiment of a display device includes a display panel, a first film attached to the display panel, a first alignment mark disposed on one of the display panel and the first film, and a second alignment mark disposed on the other of the display panel and the first film and facing the first alignment mark, where the first alignment mark comprises a first test electrode, a second test electrode and a third test electrode, which are separated from one another, where the first test electrode of the first alignment mark includes a first facing area facing the second test electrode, the second test electrode includes a second facing area facing the first test electrode and a third facing area facing the third test electrode, and the third test electrode includes a fourth facing area facing the second test electrode, and where the first facing area, the second facing area, the third facing area and the fourth facing area have a same width as one another.

An embodiment of a method of fabricating a display device includes aligning a display panel with a first film by using a first alignment mark disposed on the display panel and a second alignment mark disposed on the first film, attaching the display panel to the first film by an adhesive member, and measuring an insulation resistance of the adhesive member through at least one of the first alignment mark and the second alignment mark, where the at least one of the first alignment mark and the second alignment mark includes a first test electrode and a second test electrode, which are separated from and insulated from each other, and where the measuring the insulation resistance of the adhesive member includes measuring the insulation resistance of the adhesive member disposed between the first test electrode and the second test electrode.

According to embodiments of the disclosure, an insulation resistance may be measured and an insulation gap may be determined.

BRIEF DESCRIPTION OF THE DRAWINGS

The above and other features of the disclosure will become more apparent by describing in detail embodiments thereof with reference to the accompanying drawings, in which.

DETAILED DESCRIPTION

Figure 1:
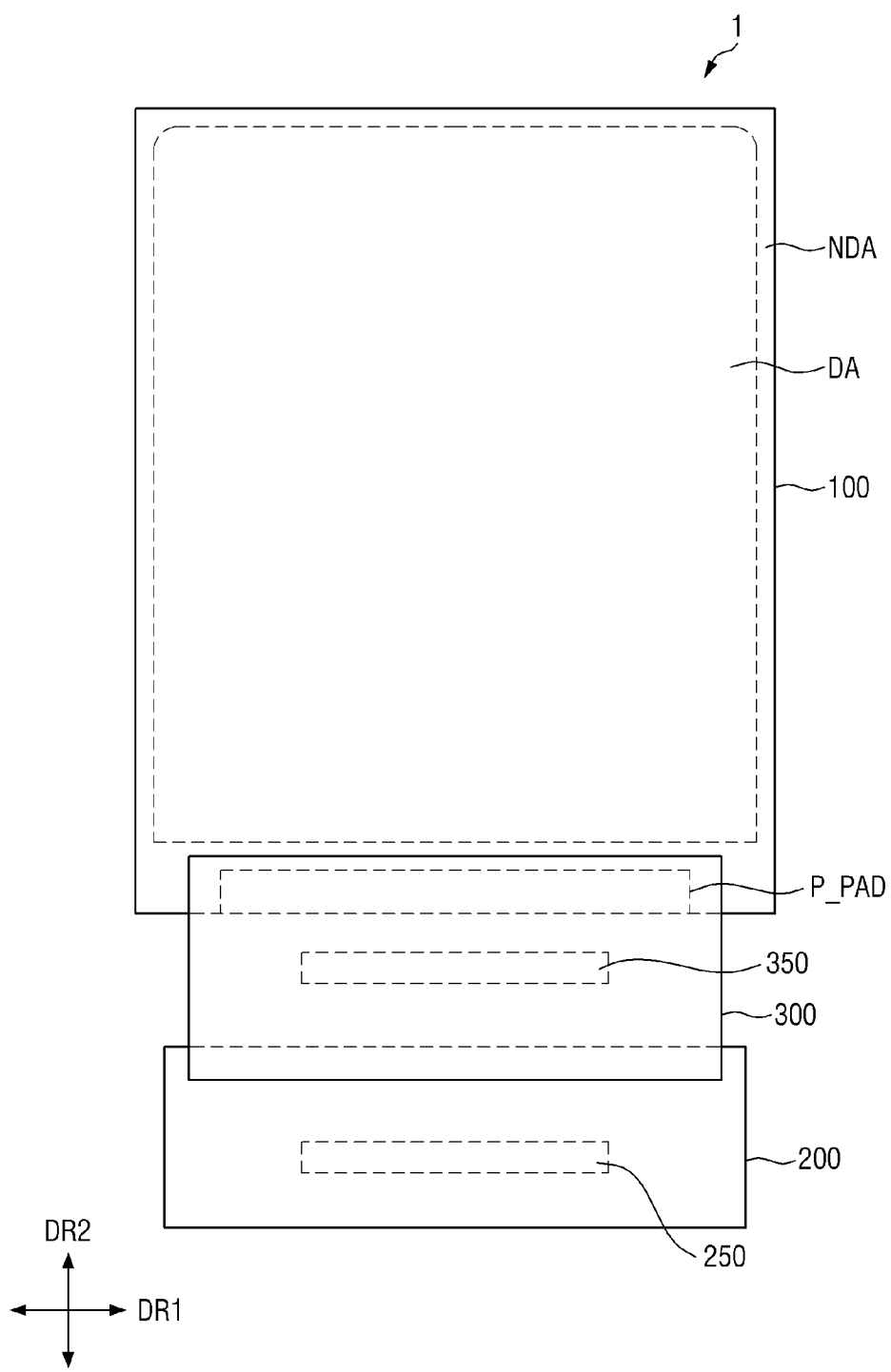
FIG. 1 is a plan view showing the layout of a display device according to an embodiment of the disclosure.

The invention will now be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a plan view showing the layout of a display device according to an embodiment of the disclosure.

Referring to FIG. 1, an embodiment of a display device 1 displays moving images or still images. The display device 1 may be used as the display screen of portable electronic devices such as a mobile phone, a smart phone, a tablet personal computer ("PC"), a smart watch, a watch phone, a mobile communications terminal, an electronic notebook, an electronic book, a portable multimedia player ("PMP"), a navigation device and a ultra mobile PC ("UMPC"), as well as the display screen of various products such as a television, a notebook-type computer, a monitor, a billboard and an Internet of Things ("IoT") device.

In an embodiment, as show in FIG. 1, the display device 1 may include a display panel 100 where images are displayed, a first film 300 connected to the display panel 100, and a second film 200 connected to the first film 300.

In one embodiment, for example, the display panel 100 may be an organic light-emitting display panel. Herein, for convenience of description, embodiments where the display panel 100 is an organic light-emitting display panel will be described in detail. It is, however, to be understood that other types of display panel such as a liquid-crystal display panel, a quantum-dot organic light-emitting display panel, a quantum-dot liquid-crystal display panel, a quantum-nano light-emitting display panel and a micro light-emitting diode display panel may also be used as the display panel 100.

In an embodiment, the display panel 100 includes a display area DA where a plurality of pixel areas is disposed, and a non-display area NDA disposed around the display area DA. The display area DA may have a rectangular shape having corners at the right angle or rounded corners when viewed from a top plan view, e.g., a plan view in a thickness direction of the display panel 100. The display area DA may include shorter sides and longer sides. The shorter sides of the display area DA may extend in a first direction DR1. The longer sides of the display area DA may extend in a second direction DR2. It is, however, to be understood that the disclosure is not limited thereto. The shape of the display area DA is not limited to a rectangle, and alternatively, the display area DA may have other shapes such as a circle and an ellipse.

In an embodiment, the non-display area NDA may be disposed adjacent to the two shorter sides and the two longer sides of the display area DA. In such an embodiment, the display area NA may surround all of the sides of the display area DA and may form the edges of the display area DA. It is, however, to be understood that the disclosure is not limited thereto. Alternatively, the non-display area NDA may be disposed adjacent only to the two shorter sides of the display area DA or only to the two longer sides of the display area DA.

In an embodiment, signal lines for applying signals to the display area DA or driving circuits may be disposed in the non-display area NDA. In an embodiment, where the display device 1 includes a touch member, lines or circuits for applying signals to a touch area may be further disposed in the non-display area NDA.

Figure 3:
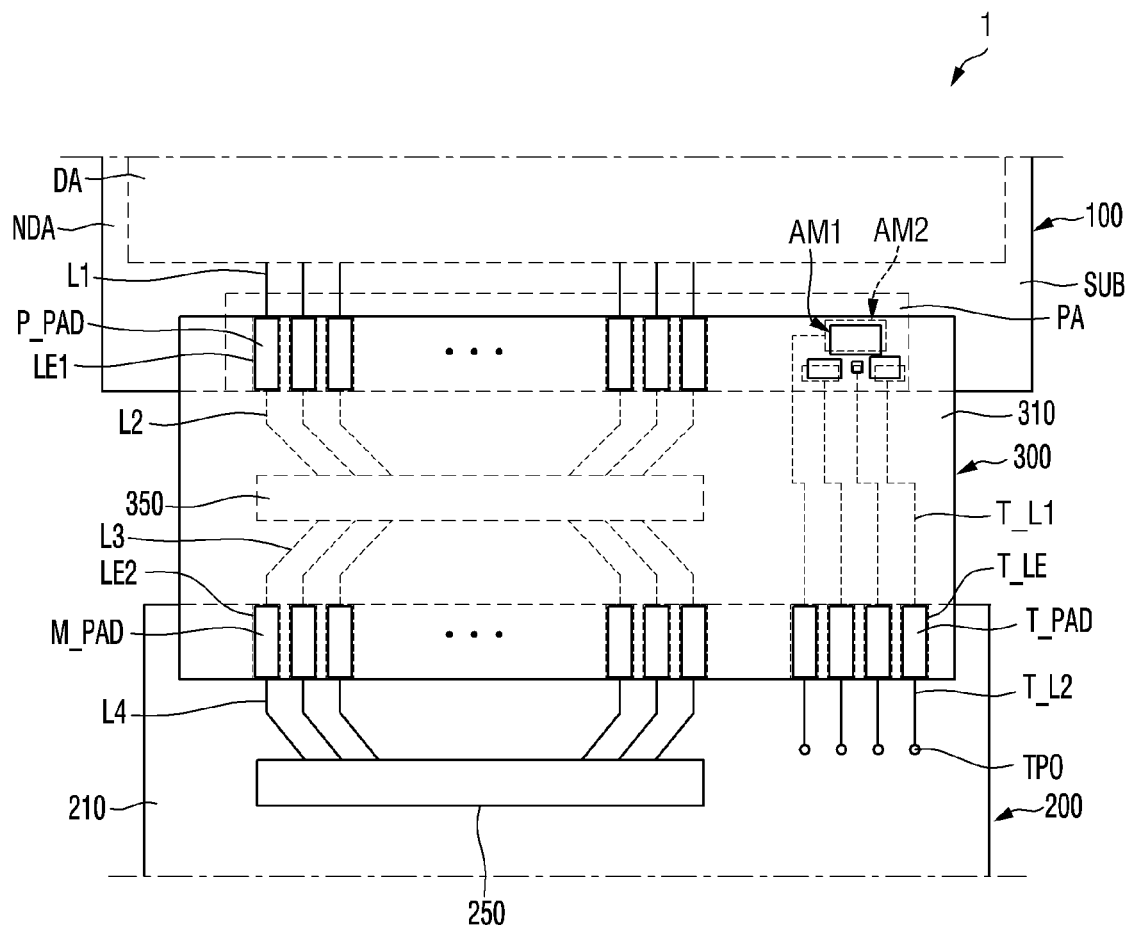
FIG. 3 is a schematic plan view showing a layout of a display panel, a first film and a second film of a display device according to an embodiment.

With reference to FIG. 3 that will be described later, the display panel 100 further includes a pad area PA. The pad area PA may be disposed in the non-display area NDA. The pad area PA may be disposed, for example, around one shorter side of the display area DA, but the disclosure is not limited thereto. It may be disposed around each of the two shorter sides of the display area DA or around each of the two shorter sides and the two longer sides of the display area DA.

The pad area PA may be electrically connected to the signal lines. The pad area PA may include a display signal line pad. In an embodiment where the display device 1 includes the touch member, the pad area PA may include a touch signal line pad.

In an embodiment, the second film 200 may be a flexible printed circuit board or a flexible printed circuit film. It is, however, to be understood that the disclosure is not limited thereto. Alternatively, the second film 200 may be a rigid substrate. In an embodiment, the second film 200 may be an integrated driver film that drives the display as well as the touch member. It is, however, to be understood that the disclosure is not limited thereto. Alternatively, a film for driving the display and a film for driving the touch member may be provided separately from each other.

In an embodiment, the first film 300 may electrically connect the second film 200 with the display panel 100. In such an embodiment, the second film 200 may be electrically connected to the display panel 100 through the first film 300. In one embodiment, for example, one end of the first film 300 may be attached to one side of the display panel 100, and an opposing end of the first film 300 may be attached to the second film 200. The first film 300 may be attached thereto by an adhesive member ACF (see FIG. 7).

In such an embodiment, the first film 300 and the display panel 100 overlap each other at least partially, and the first film 300 may be attached to the display panel 100 at an overlapping portion thereof. In such an embodiment, an adhesive member ACF (see FIG. 7) may be disposed between the first film 300 and the display panel 100, and the first film 300 and the display panel 100 may be attached together by the adhesive member ACF. In an embodiment, the first film 300 and the second film 200 overlap each other at least partially, and the first film 300 may be attached to the second film 200 at an overlapping portion thereof. In such an embodiment, an additional adhesive member may be disposed between the first film 300 and the second film 200, and the first film 300 and the second film 200 may be attached together by the adhesive member.

A driving chip 350 may be mounted on a first surface or a second surface of the first film 300. The driving chip 350 may include an integrated circuit for driving the display panel 100. The driving chip 350 may include, for example, an integrated circuit that drives the display panel 100, and may be implemented as a display panel driving chip by employing the chip on film ("COF") technique.

Alignment marks AM1 and AM2 (see FIGS. 3 and 4) may be further provided or formed in an overlapping area of the display panel 100 and the first film 300, that is, the area where the display panel 100 and the first film 300 are attached to each other. In such an embodiment, the display device 1 includes the alignment marks AM1 and AM2 (see FIG. 3), such that the display panel 100 and the first film 300 may be aligned with each other. In an embodiment, the alignment marks AM1 and AM2 (see FIG. 3) may include a plurality of test electrodes AMD11, AMD12, AMD13, AMD14, AMD21, AMD22, AMD23 and AMD24 (see FIG. 4) insulated from one another. The plurality of test electrodes AMD11, AMD12, AMD13, AMD14, AMD21, AMD22, AMD23 and AMD24 (see FIG. 4) may be spaced apart from one another by different distances. In the display device 1, by using the plurality of test electrodes AMD11, AMD12, AMD13, AMD14, AMD21, AMD22, AMD23 and AMD24 (see FIG. 4), the insulation resistance of the adhesive member ACF (see FIG. 7) may be measured, which attaches the display panel 100 to the first film 300, and the insulation gap may be determined, which will be described later in detail.

The first film 300 may be bent in a thickness direction (e.g., toward a rear side in an embodiment where the display device 1 is a top-emission light-emitting display device). Accordingly, when the first film 300 is bent, the second film 200 may be located under the display panel 100, and a part of the first film 300 may be located under the display panel 100.

Figure 2:
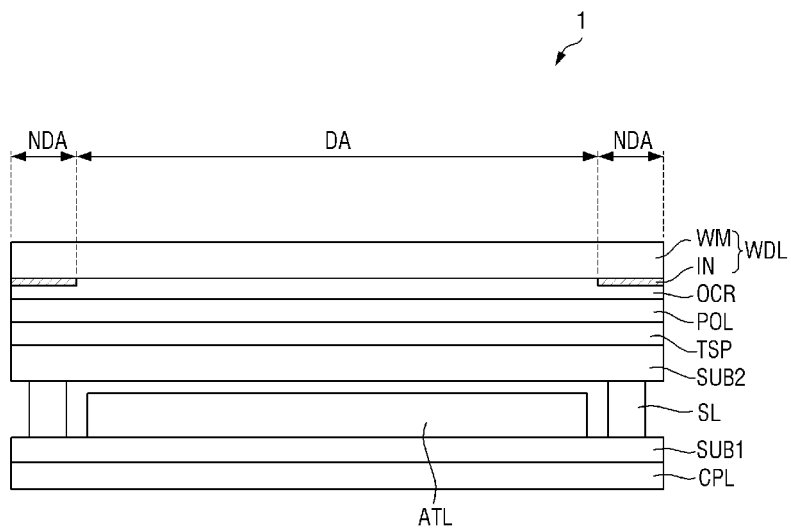
FIG. 2 is a cross-sectional view showing a stack structure of a display device according to an embodiment of the disclosure.

FIG. 2 is a cross-sectional view showing a stack structure of a display device according to an embodiment of the disclosure.

Referring to FIG. 2, an embodiment of the display device 1 may further include a touch member TSP for sensing a touch input, an anti-reflection member POL, a window member WDL, and a cover panel CPL disposed below the display panel 100, as well as the display panel 100 for providing a display screen.

The display panel 100 may include a first substrate SUB1, a second substrate SUB2, an active element layer ATL, and a sealing member SL.

The first substrate SUB1 may support the active element layer ATL disposed thereon. The first substrate SUB1 is generally transparent and may have high light transmittance. The first substrate SUB1 may include, but is not limited to, an inorganic material, e.g., glass and/or quartz. The inorganic material of the first substrate SUB1 may include, but is not limited to, silicon oxide ($SiO_2$). It is, however, to be understood that the disclosure is not limited thereto. The first substrate SUB1 may be a transparent plate or a transparent film.

The second substrate SUB2 may be disposed to face the first substrate SUB1 and to be spaced apart from the first substrate SUB1. The second substrate SUB2 may protect the active element layer ATL from outside moisture and air. The second substrate SUB2 is generally transparent and may have high light transmittance. The second substrate SUB2 may include, but is not limited to, an inorganic material, e.g., glass and/or quartz. The inorganic material of the second substrate SUB2 may include, but is not limited to, silicon oxide ($SiO_2$). It is, however, to be understood that the disclosure is not limited thereto. The second substrate SUB2 may be a transparent plate or a transparent film.

The active element layer ATL may be disposed between the first substrate SUB1 and the second substrate SUB2. The active element layer ATL may be disposed on an upper surface (or a first surface) of the first substrate SUB1. The active element layer ATL may include a light-emitting element and a thin-film transistor for driving the light-emitting element. In an embodiment, the second substrate SUB2 may be disposed on the active element layer ATL.

Although not shown in the drawings, the active element layer ATL may include a circuit driving layer and an emissive layer of a pixel. The circuit driving layer may include a circuit that drives the emissive layer of the pixel. The circuit driving layer may include a plurality of thin-film transistors. The emissive layer may include an organic emissive layer. The emissive layer may emit light at a luminance level corresponding to a driving signal transmitted thereto from the circuit driving layer. The emissive layer may be disposed on the circuit driving layer.

The sealing member SL may be disposed between the first substrate SUB1 and the second substrate SUB2. In one embodiment, for example, the sealing member SL may be disposed in the non-display area NDA of the display device 1 and may be disposed to surround the display area DA. The sealing member SL may couple the first substrate SUB1 with the second substrate SUB2, and may seal the active element layer ATL together with the first substrate SUB1 and the second substrate SUB2. According to an embodiment of the disclosure, the sealing member SL may include, but is not limited to, a frit.

In an embodiment, as described herein, the active element layer ATL may be disposed between the first substrate SUB1 and the second substrate SUB2 and is surrounded and sealed by the sealing member SL. It is, however, to be understood that the disclosure is not limited thereto. In one alternative embodiment, for example, a thin-film encapsulation layer may be disposed on the active element layer ATL, and the active element layer ATL may be encapsulated by the thin-film encapsulation layer. In such an embodiment, the thin-film encapsulation layer may include at least one of an inorganic film and an organic film, and may include a stack of multiple layers. In an embodiment, where the active element layer ATL is encapsulated by the thin-film encapsulation layer, the second substrate SUB2 and the sealing member SL may be omitted.

An inner area of the display panel 100 defined by the first substrate SUB1, the second substrate SUB2 and the sealing member SL may be between the first substrate SUB1 and the second substrate SUB2. The inner area may be in a vacuum state or may be filled with gas. The gas may be, but is not limited to, an inert gas or a normal air. In an embodiment, the inner area may be filled with a filler or the like, besides the gas.

In an embodiment, the touch member TSP may be disposed on the display panel 100. The touch member TSP may sense a touch input. The touch member TSP may be disposed on an upper surface (or first surface) of the second substrate SUB2. In an embodiment, as shown in FIG. 2, the touch member TSP may be formed integrally with the display panel 100 in the form of a touch layer, but the disclosure is not limited thereto. The touch member TSP may be located on the display panel 100 in the form of a touch panel or a touch film. The touch member TSP may include a plurality of touch electrodes. Alternatively, the touch member TSP may be omitted.

In an embodiment, the anti-reflection member POL may be disposed on the touch member TSP. The anti-reflection member POL may be attached onto the touch member TSP in the form of a polarizing film. The anti-reflection member POL polarizes the light passing therethrough. The anti-reflection member POL may reduce reflection of external light. It is, however, to be understood that the disclosure is not limited thereto. In an alternative embodiment, the anti-reflection member POL may be stacked in the form of an anti-reflection layer inside the display panel 100. In such an embodiment, the anti-reflection member POL may include a color filter that selectively transmits light of a particular wavelength, etc. In an embodiment, where the touch member TSP is omitted, the anti-reflection member POL may be attached on the second substrate SUB2.

In an embodiment, the window member WDL is disposed on the anti-reflection member POL. The window member WDL serves to cover and protect the display panel 100. The window member WDL may include a window material WM and a print layer IN disposed on the window material WM. The window member WDL may be attached on one surface of the display panel 100 through a transparent coupling layer OCR including an optically clear adhesive ("OCA"), an optically clear resin, etc. In an embodiment where the display device 1 includes the anti-reflection member POL, the window member WDL may be attached on the upper surface (or first surface) of the anti-reflection member POL.

The window material WM may include or be made of a transparent material. The window material WM may include or be made of, for example, glass or plastic The window material WM define a shape or exterior appearance of the display device 1 when viewed from the top plan view. In one embodiment, for example, where the display device 1 has a substantially rectangular shape when viewed from the top plan view, the window material WM also has a substantially rectangular shape. In one alternative embodiment, for example, where the display device 1 is circular, the window material WM may also have a circular shape.

The print layer IN may be disposed on the window material WM. The print layer IN may be disposed on a first surface and/or a second surface of the window material WM. The print layer IN may be disposed on the edge of the window material WM and may be disposed in the non-display area NDA. The print layer IN may be a light-blocking layer or a decorative layer that gives aesthetic effects. It is, however, to be understood that the disclosure is not limited thereto. Alternatively, the print layer IN may be omitted.

Figure 4:
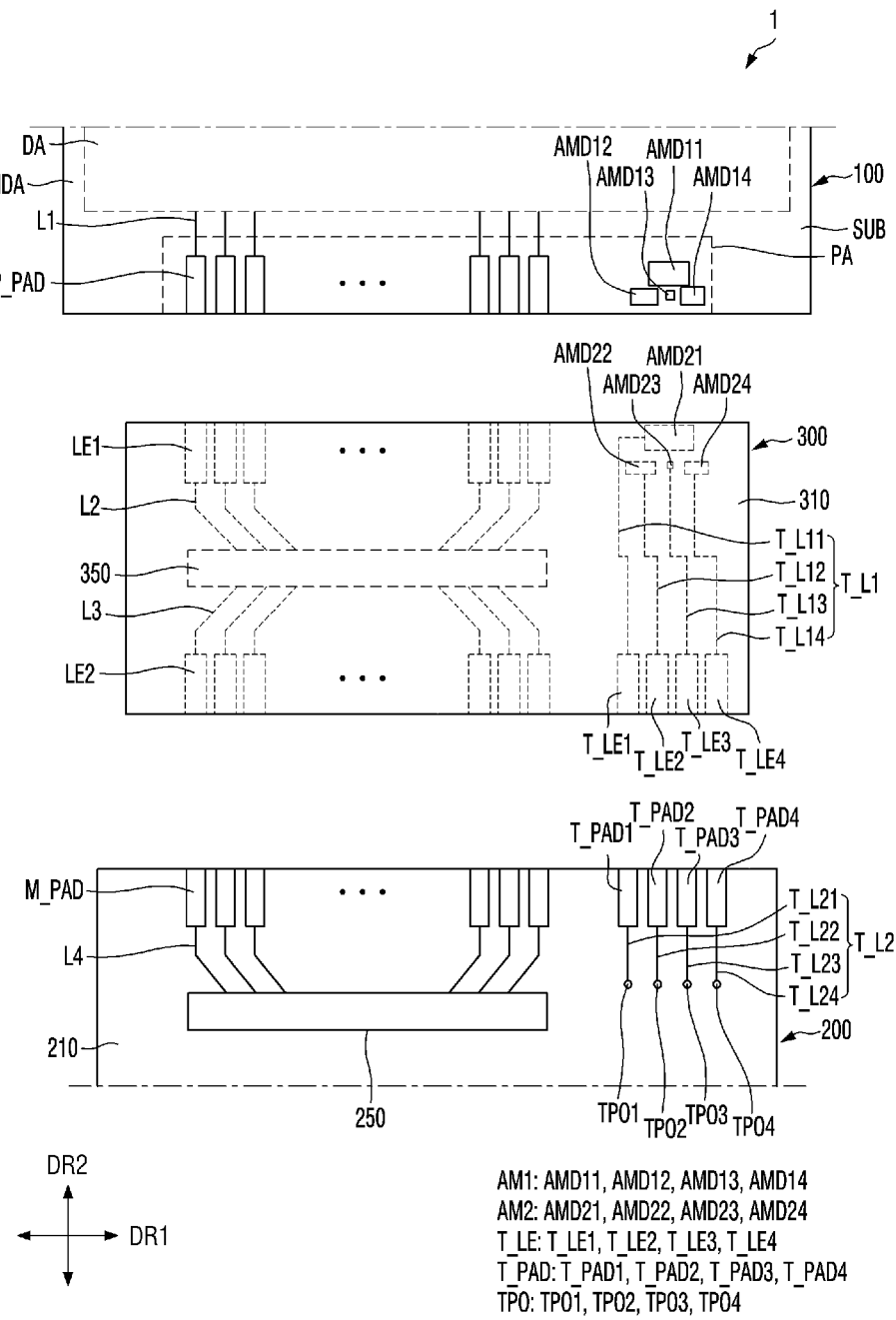
FIG. 4 is a view showing the display panel, the first film and the second film of FIG. 3, which are separated from one another.

FIG. 3 is a schematic plan view showing a layout of a display panel, a first film and a second film of a display device according to an embodiment. FIG. 4 is a view showing the display panel, the first film and the second film of FIG. 3, which are separated from one another. FIGS. 3 and 4 show the periphery of the pad area PA of the display panel 100. In FIGS. 3 and 4, a solid line may represent an element on a front surface, and a dotted line may represent an element on a rear surface.

Referring to FIGS. 3 and 4, an embodiment of the display device 1 may further include a first alignment mark AM1 and a second alignment mark AM2, and the display panel 100 may further include a panel pad P_PAD. The panel pad P_PAD and the first alignment mark AM1 may be disposed on the front surface of the substrate SUB of the display panel 100. Herein, the front surface may refer to the surface from which light exits in a case where the display device 1 is a top-emission display device.

The panel pad P_PAD may be disposed in the pad area PA of the display panel 100 on a front surface of a substrate SUB of the display panel 100. The panel pad P_PAD may be provided in plural, and a plurality of panel pads P_PAD may be repeatedly arranged along the first direction DR1. The panel pads P_PAD may include, for example, a power supply pad, a data pad, a panel dummy pad, etc.

The panel pads P_PAD may be electrically connected to the pixels. The panel pads P_PAD may be physically and/or electrically connected to the pixels in the display area DA through first signal lines L1. The first signal lines L1 may be disposed in a different layer from the panel pads P_PAD, but the disclosure is not limited thereto. Alternatively, the first signal lines L1 may be disposed in a same layer as the panel pads P_PAD.

The first alignment mark AM1 may be disposed adjacent to one side of the plurality of panel pads P_PAD in the first direction DR1 on the front surface of a substrate SUB of the display panel 100, but the disclosure is not limited thereto. In an embodiment, the first alignment mark AM1 may function as a mark during a process of attaching the display panel 100 to the first film 300. In such an embodiment, the first alignment mark AM1 along with the second alignment mark AM2 may be used to align the display panel 100 with the first film 300. The first alignment mark AM1 may have a same stack structure as the panel pads P_PAD, but the disclosure is not limited thereto.

The first alignment mark AM1 may include first to fourth test electrodes AMD11, AMD12, AMD13 and AMD14. The first to fourth test electrodes AMD11, AMD12, AMD13 and AMD14 may be separated from one another and insulated from one another. In an embodiment, the insulation resistance may be measured and the insulation gap may be measured by using the first to fourth test electrodes AMD11, AMD12, AMD13 and AMD14, which will be described later in detail.

In an embodiment, the first film 300 may include a first film substrate 310, first connection leads LE1, second connection leads LE2, and test leads T_LE. The first connection leads LE1, the second connection leads LE2 and the test leads T_LE may be disposed on a rear surface of the first film substrate 310. In such an embodiment, the second alignment mark AM2 may be disposed on a rear surface of the first film substrate 310. Herein, the rear surface may refer to a surface opposite to a surface from which light exits in an unfolded state as shown in FIG. 3, in a case where the display device 1 is a top-emission display device.

The first connection leads LE1 may be disposed at one side of the driving chip 350 in the second direction DR2, and the second connection leads LE2 may be disposed at the opposite side (i.e., a side opposite to the one side) of the driving chip 350 in the second direction DR2. The first connection leads LE1 may be electrically connected to the driving chip 350 through second signal lines L2, and the second connection leads LE2 may be electrically connected to the driving chip 350 through third signal lines L3.

In an embodiment, the first connection leads LE1 may be repeatedly arranged and spaced apart from one another in the first direction DR1. The first connection leads LE1 may correspond to the panel pads P_PAD of the display panel 100, respectively. The first connection leads LE1 may overlap the panel pads P_PAD of the display panel 100 and may be physically and/or electrically connected to the panel pads P_PAD.

In an embodiment, the second connection leads LE2 may be repeatedly arranged and spaced apart from one another in the first direction DR1. The second connection leads LE2 may correspond to main circuit pads M_PAD of the second film 200, respectively. The second connection leads LE2 may overlap the main circuit pads M_PAD of the second film 200 and may be physically and/or electrically connected to the main circuit pads M_PAD, respectively.

The second alignment mark AM2 may be disposed adjacent to one side of the first connection leads LE1 in the first direction DR1. The second alignment mark AM2 may include the first to fourth test electrodes AMD21, AMD22, AMD23 and AMD24. The first to fourth test electrodes AMD21, AMD22, AMD23 and AMD24 may be separated from one another and insulated from one another. The first to fourth test electrodes AMD21, AMD22, AMD23 and AMD24 of the second alignment mark AM2 may correspond to the first to fourth test electrodes AMD11, AMD12, AMD13 and AMD14 of the first alignment mark AM1, respectively, which will be described later in detail.

In an embodiment, when the first film 300 is attached to the display panel 100, the second alignment mark AM2 may overlap the first alignment mark AM1 and may be physically and/or electrically connected to the first alignment mark AM1. In such an embodiment, the first to fourth test electrodes AMD21, AMD22, AMD23 and AMD24 of the second alignment mark AM2 may be physically and/or electrically connected to the first to fourth test electrodes AMD11, AMD12, AMD13 and AMD14 of the first alignment mark AM1, respectively. Accordingly, the first alignment mark AM1 may be electrically connected to test points TPO of the second film 200 through the second alignment mark AM2.

The test leads T_LE may be disposed at one side of the second connection leads LE2 in the first direction DR1. The test leads T_LE may be physically and/or electrically connected to the second alignment mark AM2 through first test lines T_L1:T_L11, T_L12, T_L13 and T_L14, respectively. In an embodiment, the test leads T_LE may include first to fourth test leads T_LE1, T_LE2, T_LE3, and T_LE4. The first to fourth test leads T_LE1, T_LE2, T_LE3 and T_LE4 may be physically and/or electrically connected to the first to fourth test electrodes AMD21, AMD22, AMD23 and AMD24 of the second alignment mark AM2 through the first test lines T_L1: T_L11, T_L12, T_L13 and T_L14, respectively.

The test leads T_LE may be physically and/or electrically connected to the test pads T_PAD. In an embodiment, the first to fourth test leads T_LE1, T_LE2, T_LE3 and T_LE4 may correspond to the test pads T_PAD: T_PAD1, T_PAD2, T_PAD3 and T_PAD4 of the second film 200, respectively. The first to fourth test leads T_LE1, T_LE2, T_LE3 and T_LE4 may overlap the test pads T_PAD: T_PAD1, T_PAD2, T_PAD3 and T_PAD4 of the second film 200, respectively, and may be physically and/or electrically connected with the test pads T_PAD: T_PAD1, T_PAD2, T_PAD3 and T_PAD4 of the second film 200.

The second film 200 may include a second film substrate 210, the main circuit pads M_PAD, a main circuitry 250, the test pads T_PAD, and the test points TPO. The main circuit pads M_PAD, the main circuitry 250, the test pads T_PAD and the test points TPO may be disposed on the front surface of the second film substrate 210.

In an embodiment, the main circuit pads M_PAD may be repeatedly arranged along the first direction DR1. The main circuit pads M_PAD may be disposed at one side of the main circuitry 250 in the second direction DR2. The main circuit pads M_PAD may be electrically connected to the main circuitry 250. The main circuit pads M_PAD may be physically and/or electrically connected to fourth signal lines L4, and the main circuitry 250 may be physically and/or electrically connected to the fourth signal lines L4. Accordingly, the main circuitry 250 and the main circuit pads M_PAD may be physically and/or electrically connected to each other through the fourth signal lines L4.

In an embodiment, as shown in FIG. 3, the main circuitry 250 may be disposed on the second film 200, the disclosure is not limited thereto. Alternatively, the main circuitry 250 may be disposed on a separate element, and only the main circuit pads M_PAD, the test pads T_PAD and the test points TPO may be disposed on the second film substrate 210 of the second film 200.

The test pads T_PAD may be disposed at one side of the main circuitry pads M_PAD in the first direction DR1. The test pads T_PAD may be electrically insulated from the main circuitry 250, unlike the main circuit pads M_PAD. In such an embodiment, the test pads T_PAD may be dummy electrodes. In an embodiment, the test pads T_PAD may include first to fourth test pads T_PAD1, T_PAD2, T_PAD3, and T_PAD4.

The first to fourth test pads T_PAD1, T_PAD2, T_PAD3 and T_PAD4 may be physically and/or electrically connected to the first to fourth test leads T_LE1, T_LE2, T_LE3, and T_LE4, respectively.

The test points TPO may be spaced apart from the test pad T_PAD in the second direction DR2. The test points TPO may be physically and/or electrically connected to the test pads T_PAD through the second test lines T_L2: T_L21, T_L22, T_L23 and T_L24. In an embodiment, the test points TPO may include first to fourth test points TPO1, TPO2, TPO3 and TPO4. The first to fourth test points TPO1, TPO2, TPO3 and TPO4 may be physically and/or electrically connected to the first to fourth test pads T_PAD1, T_PAD2, T_PAD3 and T_PAD4 of the test pads T_PAD through the second test lines T_L2: T_L21, T_L22, T_L23 and T_L24, respectively.

A predetermined input voltage may be applied to the test points TPO, in which case the output resistance may be measured through the test points TPO. Accordingly, the insulation resistance of the adhesive member ACF (see FIG. 7) disposed between the test electrodes AMD11, AMD12, AMD13 and AMD14 of the first alignment mark AM1 may be measured, and the insulation gap may be determined. In an embodiment, for example, the adhesive member ACF (see FIG. 7) may be disposed between the first test electrode AMD11 and the second test electrode AMD12 in the second direction DR2.

Hereinafter, the alignment marks AM1 and AM2 will be described in greater detail with reference to FIGS. 5 to 7.

Figure 5:
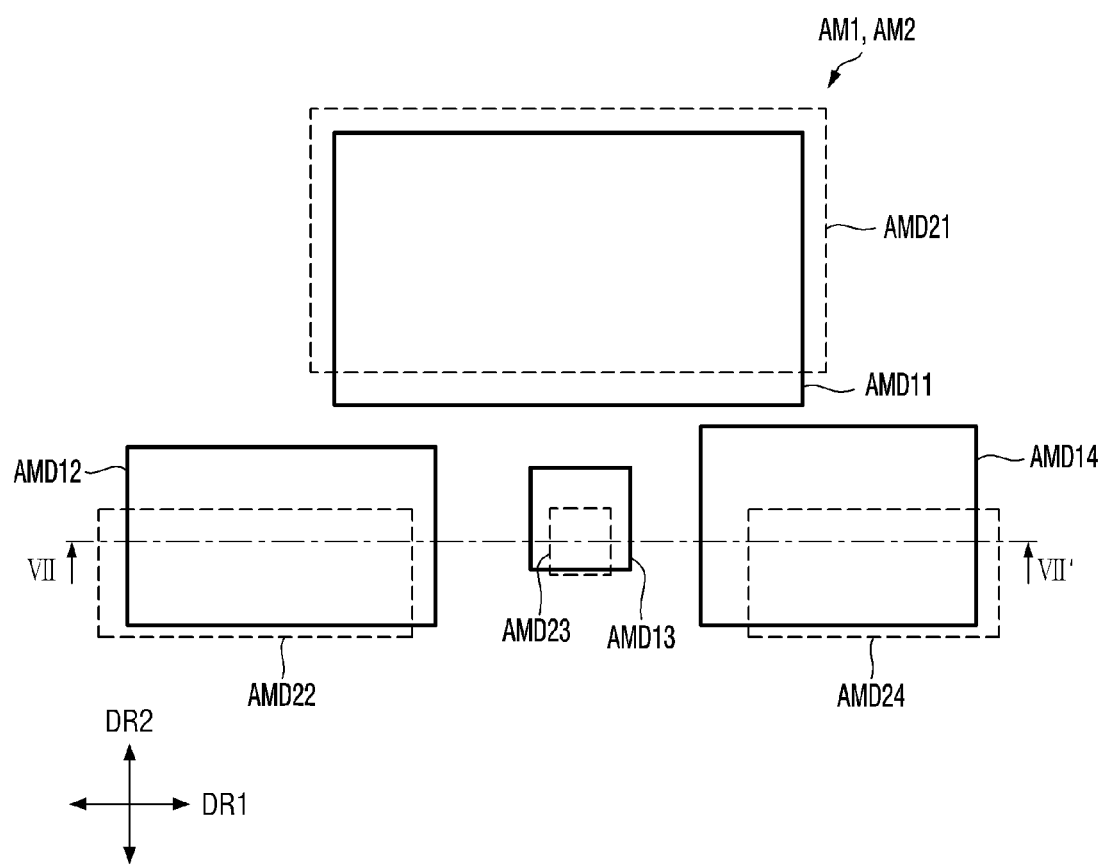
FIG. 5 is an enlarged plan view showing the first alignment mark and the second alignment mark overlapping in the display device according to an embodiment.

FIG. 5 is an enlarged plan view showing the first alignment mark and the second alignment mark overlapping in the display device according to an embodiment. FIG. 6 is a plan view showing the first alignment mark and the second alignment mark separated from each other in the display device according to an embodiment. FIG. 7 is a cross-sectional view taken along line VII-VII' of FIG. 5. In FIG. 7, the first alignment mark AM1 and the second alignment mark AM2 are illustrated reversed upside down.

Referring to FIGS. 1, 3, 5 to 7, an embodiment of the display device 1 may further include an adhesive member ACF. The adhesive member ACF may be disposed in an area where the display panel 100 and the first film 300 overlap each other. The adhesive member ACF may be interposed between an overlapping portion of the display panel 100 and the first film 300 where the display panel 100 and the first film 300 overlap each other. The display panel 100 and the first film 300 may be adhered to each other through the adhesive member ACF, and the first alignment mark AM1 and the second alignment mark AM2 may be electrically connected with each other. In an embodiment, the panel pad P_PAD of the display panel 100 and the first connection lead LE1 may be electrically connected with each other through the adhesive member ACF.

In one embodiment, for example, the adhesive member ACF may be an anisotropic conducting film, but not being limited thereto.

In an embodiment where the adhesive member ACF is an anisotropic conducting film, the adhesive member ACF may include an adhesive layer ADF and conductive balls CB. The adhesive layer ADF may attach the display panel 100 to the first film 300. The adhesive layer ADF may cover the panel pads P_PAD and the first alignment mark AM1 of the display panel 100, and the first connection leads LE1 and the second alignment mark AM2 of the first film 300. The adhesive layer ADF may include an adhesive material capable of attaching the display panel 100 to the first film 300, and may include an insulating material. In such an embodiment, the adhesive layer ADF may include a material having adhesiveness and insulation properties. In an embodiment, the adhesive layer ADF may include, for example, at least one selected from an epoxy resin, an acrylic resin, and a polyester resin, but not being limited thereto.

In an embodiment, the conductive balls CB may have, but is not limited to, a spherical shape. In such an embodiment where the conductive balls CB have a spherical shape, the conductive balls CB may be formed by coating a spherical polymer with at least one metal selected from nickel (Ni), cobalt (Co), gold (Au), silver (Ag) and copper (Cu). The conductive balls CB may be disposed between the first alignment mark AM1 and the second alignment mark AM2, to electrically connect the first alignment mark AM1 with the second alignment mark AM2. In such an embodiment, one side of the conductive balls CB may be in direct contact with the first alignment mark AM1 while an opposite side of the conductive balls CB may be in direct contact with the second alignment mark AM2. Accordingly, the test electrodes AMD11, AMD12, AMD13 and AMD14 of the first alignment mark AM1 may be electrically connected to the test electrodes AMD21, AMD22, AMD23 and AMD24 of the second alignment mark AM2, respectively.

In an embodiment where the adhesive member ACF is an anisotropic conductive film, the display panel 100 and the first film 300 may be attached to each other by applying heat or pressing thereto.

In an embodiment, although not shown in the drawings, the adhesive member ACF may have a multilayer structure, e.g., a stack of multiple layers. In such an embodiment, the adhesive member ACF may further include an additional insulating layer on and/or under the adhesive layer ADF, in addition to the adhesive layer ADF and the conductive balls CB. The additional insulating layer may have insulation properties and adhesiveness. Accordingly, the additional insulating layer may improve the adhesion between the adhesive layer ADF and the display panel 100 and between the adhesive layer ADF and the first film 300, and may cover and protect the adhesive layer ADF and the conductive balls CB.

In an embodiment, although not shown in the drawings, the conductive balls CB may electrically connect the panel pad P_PAD of the display panel 100 with the first connection lead LE1 of the first film 300, as well as may electrically connect the first alignment mark AM1 with the second alignment mark AM2.

In an embodiment, as described above, the adhesive member ACF may be an anisotropic conducting film including the conductive balls CB, but the disclosure is not limited thereto. Alternatively, the adhesive member ACF may be an adhesive film not including the conductive balls CB. In such an embodiment, the display panel 100 and the first film 300 may be attached together by using ultrasonic waves.

In an embodiment, the first film 300 and the second film 200 may also be attached together by an adhesive member. The adhesive member attaching the first film 300 to the second film 200 may be an anisotropic conducting film or an adhesive film that does not include conductive balls CB.

Figure 6:
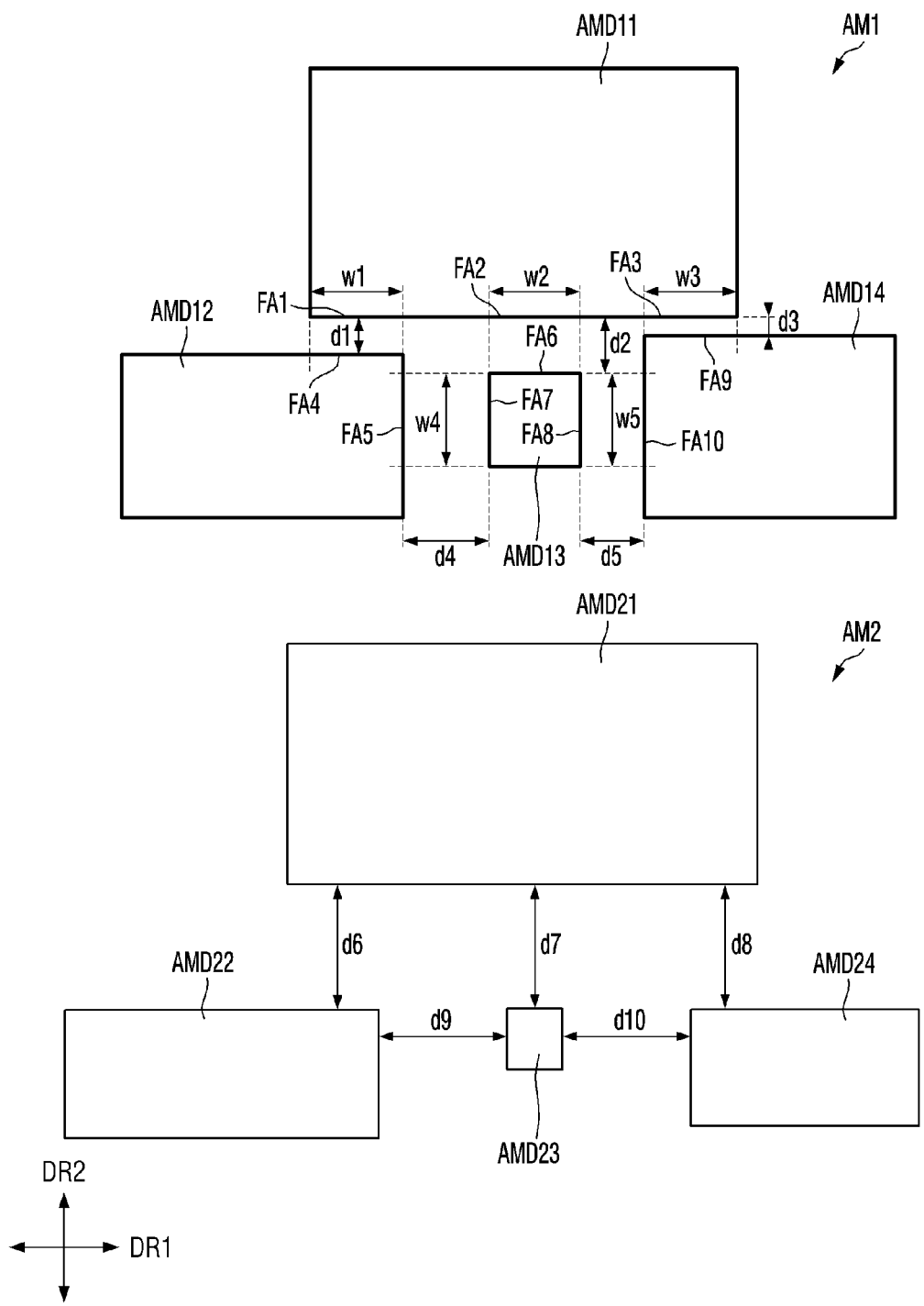
FIG. 6 is a plan view showing the first alignment mark and the second alignment mark separated from each other in the display device according to an embodiment.

In an embodiment, as shown in FIGS. 5 and 6, the first alignment mark AM1 may include first to fourth test electrodes AMD11, AMD12, AMD13 and AMD14. The first to fourth test electrodes AMD11, AMD12, AMD13 and AMD14 may be separated from one another by certain distances. In such an embodiment, the first to fourth test electrodes AMD11, AMD12, AMD13 and AMD14 may be insulated from one another.

The first test electrode AMD11 may be located at one side of the second test electrode AMD12, the third test electrode AMD13 and the fourth test electrode AMD14 in the second direction DR2. The second test electrode AMD12 may be located at the opposite side of the first test electrode AMD11 in the second direction DR2, and the opposite side of the third test electrode AMD13 and the fourth test electrode AMD14 in the first direction DR1. The third test electrode AMD13 may be disposed at the opposite side of the first test electrode AMD11 in the second direction DR2 and may be disposed between the second test electrode AMD12 and the fourth test electrode AMD14 in the first direction DR1. The fourth test electrode AMD14 may be located at the opposite side of the first test electrode AMD11 in the second direction DR2, and may be disposed at one side of the second test electrode AMD12 and the third test electrode AMD13 in the first direction DR1.

In one embodiment, for example, the first test electrode AMD11 may be located at the upper side of the second test electrode AMD12, the third test electrode AMD13 and the fourth test electrode AMD14 when viewed from the top plan view. The second test electrode AMD12 may be located at the lower side of the first test electrode AMD11 and may be disposed at the left side of the third test electrode AMD13 and the fourth test electrode AMD14. The third test electrode AMD13 may be disposed at the lower side of the first test electrode AMD11 and may be disposed between the second test electrode AMD12 and the fourth test electrode AMD14. The fourth test electrode AMD14 may be located at the lower side of the first test electrode AMD11 and may be disposed on the right side of the second test electrode AMD12 and the third test electrode AMD13. It is, however, to be understood that the disclosure is not limited thereto.

The first test electrode AMD11, the second test electrode AMD12, the third test electrode AMD13 and the fourth test electrode AMD14 may have different sizes or areas when viewed from the top plan view. It is, however, to be understood that the disclosure is not limited thereto. In one embodiment, for example, the second test electrode AMD12 and the fourth test electrode AMD14 may have a same area as each other when viewed from the top plan view. In such an embodiment, the second test electrode AMD12 and the fourth test electrode AMD14 may have a same area as the first test electrode AMD11 when viewed from the top plan view.

In an embodiment, as shown in FIGS. 5 and 6, each of the first test electrode AMD11, the second test electrode AMD12, the third test electrode AMD13 and the fourth test electrode AMD14 may have a quadrangular shape when viewed from the top plan view, but the disclosure is not limited thereto. In one alternative embodiment, for example, the first test electrode AMD11, the second test electrode AMD12, the third test electrode AMD13 and the fourth test electrode AMD14 may have a polygonal shape such as a triangle, a pentagon and a hexagon, or may have a shape such as a circle and an ellipse.

The first test electrode AMD11, the second test electrode AMD12, the third test electrode AMD13 and the fourth test electrode AMD14 may face (or overlap in the first direction DR1 or in the second direction DR2) each other at least partially. In one embodiment, for example, the first test electrode AMD11 may at least partially face (or overlap in the second direction DR2) each of the second test electrode AMD12, the third test electrode AMD13 and the fourth test electrode AMD14. The second test electrode AMD12 may at least partially face each of the first test electrode AMD11 and the third test electrode AMD13. The third test electrode AMD13 may at least partially face each of the first test electrode AMD11, the second test electrode AMD12 and the fourth test electrode AMD14. The fourth test electrode AMD14 may at least partially face each of the first test electrode AMD11 and the third test electrode AMD13.

In an embodiment, a first side of the first test electrode AMD11 may face the second test electrode AMD12, the third test electrode AMD13 and the fourth test electrode AMD14 when viewed from the top plan view. The first side of the first test electrode AMD11 may include a first facing area (or portion) FA1 facing the second test electrode AMD12, a second facing area FA2 facing the third test electrode AMD13 and a third facing area FA3 facing the fourth test electrode AMD14 when viewed from the top plan view: The first side of the first test electrode AMD11 may extend in the first direction DR1, and may be located on the opposite side of the first test electrode AMD11 in the second direction DR2.

In one embodiment, for example, the lower side of the first test electrode AMD11 may include a first facing area FA1 facing the second test electrode AMD12, a second facing area FA2 facing the third test electrode AMD13 and a third facing area FA3 facing the fourth test electrode AMD14 when viewed from the top plan view.

At least a part of a first side of the second test electrode AMD12 may face the first test electrode AMD11, and at least a part of a second side of the second test electrode AMD12 may face the third test electrode AMD13 when viewed from the top plan view. When viewed from the top plan view, the first side of the second test electrode AMD12 may include a fourth facing area FA4 facing the first test electrode AMD11, and the second side of the second test electrode AMD12 may include a fifth facing area FA5 facing the third test electrode AMD13. The first side of the second test electrode AMD12 may extend in the first direction DR1 and may be located at one side of the second test electrode AMD12 in the second direction DR2. The second side of the second test electrode AMD12 may extend in the second direction DR2 and may be located at one side of the second test electrode AMD12 in the first direction DR1.

In one embodiment, for example, the upper side of the second test electrode AMD12 may include the fourth facing area FA4 facing the first test electrode AMD11, and the right side of the second test electrode AMD12 may include the fifth facing area FA5 facing the third test electrode AMD13 when viewed from the top plan view.

At least a part of a first side of the third test electrode AMD13 may face the first test electrode AMD11, at least a part of a second side of the third test electrode AMD13 may face the second test electrode AMD12, and at least a part of a third side of the third test electrode AMD13 may face the fourth test electrode AMD14 when viewed from the top plan view. When viewed from the top plan view, the first side of the third test electrode AMD13 may include a sixth facing area FA6 facing the first test electrode AMD11, the second side of the third test electrode AMD13 may include a seventh facing area FA7 facing the second test electrode AMD12, and the third side of the third test electrode AMD13 may include an eighth facing area FA8 facing the fourth test electrode AMD14. The first side of the third test electrode AMD13 may extend in the first direction DR1 and may be located at one side of the third test electrode AMD13 in the second direction DR2. The second side and third side of the third test electrode AMD13 may extend in the second direction DR2 and may be located at one side and the opposite side of the third test electrode AMD13 in the first direction DR1, respectively.

In one embodiment, for example, the upper side of the third test electrode AMD13 may include the sixth facing area FA6 facing the first test electrode AMD11, the left side of the third test electrode AMD13 may include the seventh facing area FA7 facing the second test electrode AMD12, and the right side of the third test electrode AMD13 may include the eighth facing area FA8 facing the fourth test electrode AMD14. In an embodiment, as show in FIG. 6, each of the first, second and third sides of the third test electrode AMD13 may entirely face the first test electrode AMD11, the second test electrode AMD12 and the fourth test electrode AMD14, but the disclosure is not limited thereto.

At least a part of a first side of the fourth test electrode AMD14 may face the first test electrode AMD11, and at least a part of a second side of the fourth test electrode AMD14 may face the third test electrode AMD13 when viewed from the top plan view. When viewed from the top plan view, the first side of the fourth test electrode AMD14 may include a ninth facing area FA9 facing the first test electrode AMD11, and the second side of the fourth test electrode AMD14 may include a tenth facing area FA10 facing the third test electrode AMD13. The first side of the fourth test electrode AMD14 may extend in the first direction DR1 and may be located at one side of the fourth test electrode AMD14 in the second direction DR2. The second side of the fourth test electrode AMD14 may extend in the second direction DR2 and may be located at the opposite side of the fourth test electrode AMD14 in the first direction DR1.

In one embodiment, for example, the upper side of the fourth test electrode AMD14 may include the ninth facing area FA9 facing the first test electrode AMD11, and the left side of the fourth test electrode AMD14 may include the tenth facing area FA10 facing the third test electrode AMD13 when viewed from the top plan view.

The first facing area FA1 of the first test electrode AMD11 and the fourth facing area FA4 of the second test electrode AMD12 may face each other entirely. The second facing area FA2 of the first test electrode AMD11 and the sixth facing area FA6 of the third test electrode AMD13 may face each other entirely. The third facing area FA3 of the first test electrode AMD11 and the ninth facing area FA9 of the fourth test electrode AMD14 may face each other entirely. The fifth facing area FA5 of the second test electrode AMD12 and the seventh facing area FA7 of the third test electrode AMD13 may face each other entirely. The eighth facing area FA8 of the third test electrode AMD13 and the tenth facing area FA10 of the fourth test electrode AMD14 may face each other entirely.

The distances between the respective facing areas may be different from one another. In an embodiment, a first distance d1 between the first facing area FA1 of the first test electrode AMD11 and the fourth facing area FA4 of the second test electrode AMD12, a second distance d2 between the second facing area FA2 of the first test electrode AMD11 and the sixth facing area FA6 of the third test electrode AMD13, a third distance d3 between the third facing area FA3 of the first test electrode AMD11 and the ninth facing area FA9 of the fourth test electrode AMD14, a fourth distance d4 between the fifth facing area FA5 of the second test electrode AMD12 and the seventh facing area FA7 of the third test electrode AMD13, and a fifth distance d5 between the eighth facing area FA8 of the third test electrode AMD13 and the tenth facing area FA10 of the fourth test electrode AMD14 may be different from one another. It is, however, to be understood that the disclosure is not limited thereto.

Each of the distances d1, d2, d3, d4 and d5 between the respective facing areas may be in a range of about 0.1 micrometer (μm) to about 30 μm, or may be in a range of about 1 μm to about 15 μm. In one embodiment, for example, the first distance d1 may be in a range of about 3 μm to about 5 μm, e.g., may be about 4 μm. The second distance d2 may be in a range of about 5 μm to about 7 μm, e.g., may be about 6 μm. The third distance d3 may be in a range of about 1 μm to about 3 μm, e.g., may be about 2 μm. The fourth distance d4 may be in a range of about 9 μm to about 11 μm, e.g., may be about 10 μm. The fifth distance d5 may be in a range of about 7 μm to about 9 μm, e.g., may be about 8 μm. It is, however, to be understood that the size of each of the distances d1, d2, d3, d4 and d5 is not limited thereto.

Each of the distances d1, d2, d3, d4 and d5 between the respective facing areas may be substantially uniform (or constant) in the space therebetween. In such an embodiment, the first distance d1 between the first facing area FA1 of the first test electrode AMD11 and the fourth facing area FA4 of the second test electrode AMD12 may be substantially uniform in the area where the first facing area FA1 of the first test electrode AMD11 faces the fourth facing area FA4 of the second test electrode AMD12. In one embodiment, for example, where the first distance d1 is about 4 µm, the distance between the first facing area FA1 of the first test electrode AMD11 and the fourth facing area FA4 of the second test electrode AMD12 may be maintained at about 4 µm in the space therebetween.

In an embodiment, the second distance d2 between the second facing area FA2 of the first test electrode AMD11 and the sixth facing area FA6 of the third test electrode AMD13 may be substantially uniform in the area where the second facing area FA2 of the first test electrode AMD11 faces the sixth facing area FA6 of the third test electrode AMD13. The third distance d3 between the third facing area FA3 of the first test electrode AMD11 and the ninth facing area FA9 of the fourth test electrode AMD14 may be substantially uniform in the area where the third facing area FA3 of the first test electrode AMD11 faces the ninth facing area FA9 of the fourth test electrode AMD14. The fourth distance d4 between the fifth facing area FA5 of the second test electrode AMD12 and the seventh facing area FA7 of the third test electrode AMD13 may be substantially uniform in the area where the fifth facing area FA5 of the second test electrode AMD12 faces the seventh facing area FA7 of the third test electrode AMD13. The fifth distance d5 between the eighth facing area FA8 of the third test electrode AMD13 and the tenth facing area FA10 of the fourth test electrode AMD14 may be substantially uniform in the area where the eighth facing area FA8 of the third test electrode AMD13 faces the tenth facing area FA10 of the fourth test electrode AMD14.

The corresponding facing areas FA1, FA2, FA3, FA4, FA5, FA6, FA7, FA8, FA9 and FA10 of the test electrodes AMD11, AMD12, AMD13 and AMD14 may have a same width as each other. It is, however, to be understood that the disclosure is not limited thereto. In an embodiment, for example, the facing areas FA1 and FA4, FA2 and FA6, FA3 and FA9, FA5 and FA7, and FA8 and FA10 of the test electrodes AMD11 AMD12, AMD13 and AMD14 facing each other may have widths difference from each other, respectively. In an embodiment, the first facing area FA1 of the first test electrode AMD11 and the fourth facing area FA4 of the second test electrode AMD12 may have a same width as each other, i.e., a first width w1. The second facing area FA2 of the first test electrode AMD11 and the sixth facing area FA6 of the third test electrode AMD13 may have a same width as each other, i.e., a second width w2. The third facing area FA3 of the first test electrode AMD11 and the ninth facing area FA9 of the fourth test electrode AMD14 may have a same width as each other, i.e., a third width w3. The fifth facing area FA5 of the second test electrode AMD12 and the seventh facing area FA7 of the third test electrode AMD13 may have a same width as each other, i.e., a fourth width w4. The eighth facing area FA8 of the third test electrode AMD13 and the tenth facing area FA10 of the fourth test electrode AMD14 may have a same width as each other, i.e., a fifth width w5. In an embodiment, all of the first to fifth widths w1, w2, w3, w4 and w5 may be substantially equal to one another. It is, however, to be understood that the disclosure is not limited thereto. Alternatively, only some of the first to fifth widths w1, w2, w3, w4 and w5 may be substantially equal to one another.

In such an embodiment, the distances d1, d2, d3, d4 and d5 between the facing areas FA1, FA2, FA3, FA4, FA5, FA6, FA7, FA8, FA9 and FA10 of the test electrodes AMD11, AMD12, AMD13 and AMD14 may be different from one another, the distances d1, d2, d3, d4 and d5 may be substantially uniform, and the widths w1, w2, w3, w4 and w5 of the facing areas FA1, FA2, FA3, FA4, FA5, FA6, FA7, FA8, FA9 and FA10 may all be substantially equal to one another.

Accordingly, when the test electrodes AMD11, AMD12, AMD13 and AMD14 are electrically connected to the test points TPO1, TPO2, TPO3 and TPO4 (see FIG. 4), respectively, the insulation resistance of the adhesive member ACF disposed between the facing areas FA1, FA2, FA3, FA4, FA5, FA6, FA7, FA8, FA9 and FA10 of the test electrodes AMD11, AMD12, AMD13 and AMD14 having different distances may be measured by selecting test points from among the test points TPO1, TPO2, TPO3 and TPO4 (see FIG. 4).

In an embodiment, by selecting test points from among the test points TPO1, TPO2, TPO3 and TPO4 (see FIG. 4), it is possible to measure the insulation resistance according to the thickness of the adhesive member ACF that insulates two conductors (e.g., the test electrodes AMD11, AMD12, AMD13 and AMD14) from each other or the width between the test electrodes AMD11, AMD12, AMD13 and AMD14 when viewed from the top plan view. In one embodiment, for example, by selecting the first test point TPO1 and the second test point TPO2, the insulation resistance of the adhesive member ACF that is disposed between the first test electrode AMD11 and the second test electrode AMD12 of the first alignment mark AM1 and has the thickness substantially equal to the first distance d1 may be measured. In an embodiment, by selecting the first test point TPO1 and the third test point TPO3, the insulation resistance of the adhesive member ACF that is disposed between the first test electrode AMD11 and the third test electrode AMD13 of the first alignment mark AM1 and has the thickness substantially equal to the second distance d2 may be measured.

In such an embodiment, as described above, the spacing between the leads, the lines and the pads of the display device 1 may be adjusted based on the measured insulation resistance of the adhesive member ACF. In such an embodiment, the reliability of the display device 1 may be improved. In such an embodiment, by dividing the first alignment mark AM1 and the second alignment mark AM2 into several parts, which are spaced apart from one another by different distances, the insulation resistance according to the thickness of the adhesive member ACF may be easily measured. In such an embodiment, by dividing the first alignment mark AM1 and the second alignment mark AM2 into several parts, insulation resistance may be effectively measured without using any additional element. Accordingly, an increase in process cost, and a decrease in process efficiency may be substantially suppressed or effectively prevented.

The second alignment mark AM2 may include the first to fourth test electrodes AMD21, AMD22, AMD23 and AMD24. The first to fourth test electrodes AMD21, AMD22, AMD23 and AMD24 may be separated from one another by a certain distance. In an embodiment, the first to fourth test electrodes AMD21, AMD22, AMD23 and AMD24 may be insulated from one another. The shape of the second alignment mark AM2 may be substantially the same as the shape of the first alignment mark AM1 when viewed from the top plan view. The first to fourth test electrodes AMD21, AMD22, AMD23 and AMD24 of the second alignment mark AM2 may correspond to the first to fourth test electrodes AMD11, AMD12, AMD13 and AMD14 of the first alignment mark AM1, respectively.

When the first film 300 is attached on the display panel 100, the second alignment mark AM2 may face the first alignment mark AM1.

The first to fourth test electrodes AMD21, AMD22, AMD23 and AMD24 of the second alignment mark AM2 may be spaced apart from one another by sixth to tenth distances d6, d7, d8, d9 and d10. The sixth to tenth distances d6, d7, d8, d9 and d10 may be greater than the first to fifth distances d1, d2, d3, d4 and d5 of the first alignment mark AM1.

In an embodiment, each of the sixth to tenth distances d6, d7, d8, d9 and d10 may be in a range of about 13 μm to about 27 μm, may be in a range of about 15 μm to about 25 μm, in a range of about 17 μm to about 23 μm, or may be about 20 μm. The sixth to tenth distances d6, d7, d8, d9 and d10 may be all equal to one another, but the disclosure is not limited thereto. The sixth to tenth distances d6, d7, d8, d9 and d10 may all be different from one another or some of the sixth to tenth distances d6, d7, d8, d9 and d10 may be equal to one another.

When the first film 300 is attached on the display panel 100 so that the first alignment mark AM1 and the second alignment mark AM2 overlap each other, the test electrodes AMD21, AMD22, AMD23 and AMD24 of the second alignment mark AM2 may not overlap the spaces between the test electrodes AMD11, AMD12, AMD13 and AMD14 of the first alignment mark AM1.

In one embodiment, for example, the lower side of the first test electrode AMD21 of the second alignment mark AM2 may be aligned with the lower side of the first test electrode AMD11 of the first alignment mark AM1, or the lower side of the first test electrode AMD21 of the second alignment mark AM2 may be located more inwardly than the lower side of the first test electrode AMD11 of the first alignment mark AM1 overlapping the second alignment mark AM2.

In an embodiment, the lower side of the first test electrode AMD11 of the first alignment mark AM1 may protrude from the lower side of the first test electrode AMD21 of the second alignment mark AM2 in the second direction DR2 (e.g., the downward direction in FIG. 5). Accordingly, the first test electrode AMD21 of the second alignment mark AM2 may overlap none of the area where the first test electrode AMD11 of the first alignment mark AM1 faces the second test electrode AMD12, the area where the first test electrode AMD11 of the first alignment mark AM1 faces the third test electrode AMD13, and the area where the first test electrode AMD11 of the first alignment mark AM1 faces the fourth test electrode AMD14.

In an embodiment, the upper side and the right side of the second test electrode AMD22 of the second alignment mark AM2 may be aligned with the upper side and the right side of the second test electrode AMD12 of the first alignment mark AM1, respectively, or may be disposed more inwardly than the upper side and the right side of the second test electrode AMD12 of the first alignment mark AM1, respectively. In an embodiment, as shown in FIG. 5, the first side of the second test electrode AMD12 of the first alignment mark AM1 may protrude outward than a side (e.g., an upper side in the second direction DR2) of the second test electrode AMD22 of the second alignment mark AM2 with respect to the second test electrode AMD12 of the first alignment mark AM1 and the second test electrode AMD22 of the second alignment mark AM2, and the first side of the first test electrode AMD11 of the first alignment mark AM1 may protrude outward than a side (e.g., a lower side in the second direction DR2) of the first test electrode AMD21 of the second alignment mark AM2 with respect to the first test electrode AMD11 of the first alignment mark AM1 and the first test electrode AMD21 of the second alignment mark AM2. In an embodiment, the second test electrode AMD22 of the second alignment mark AM2 and the first test electrode AMD21 of the second alignment mark AM2 may be spaced apart from each other in the second direction DR2 with the adhesive member ACF interposed therebetween.

The upper side, the left side and the right side of the third test electrode AMD23 of the second alignment mark AM2 may be aligned with the upper side, the left side and the right side of the third test electrode AMD13 of the first alignment mark AM1, respectively, or may be disposed more inwardly than the upper side, the left side and the right side of the third test electrode AMD13 of the first alignment mark AM1, respectively.

The upper side and the left side of the fourth test electrode AMD24 of the second alignment mark AM2 may be aligned with the upper side and the left side of the fourth test electrode AMD14 of the first alignment mark AM1, respectively, or may be disposed more inwardly than the upper side and the left side of the fourth test electrode AMD14 of the first alignment mark AM1, respectively.

Accordingly, by using the first to fourth test electrodes AMD11, AMD12, AMD13 and AMD14 of the first alignment mark AM1, the reliability of the process of measuring the insulation resistance and determining the insulation gap may be improved. In such an embodiment, the first to fourth test electrodes AMD21, AMD22, AMD23 and AMD24 of the second alignment mark AM2 may have no influence on the distances d1, d2, d3, d4 and d5 between the first to fourth test electrodes AMD11, AMD12, AMD13 and AMD14 of the first alignment mark AM1, and thus the insulation resistance and the insulation gap may be measured based on the distances d1, d2, d3, d4 and d5 between the first to fourth test electrodes AMD11, AMD12, AMD13 and AMD14 of the first alignment mark AM1. As a result, the reliability of the measurement results may be improved.

In such an embodiment where the first alignment mark AM1 includes the first to fourth test electrodes AMD11, AMD12, AMD13 and AMD14 and the second alignment mark AM2 includes the first to fourth test electrodes AMD21, AMD22, AMD23 and AMD24, the first alignment mark AM1 and the second alignment mark AM2 may function as alignment marks.

In such an embodiment, even though each of the first alignment mark AM1 and the second alignment mark AM2 is divided into a plurality of parts, the first alignment mark AM1 and the second alignment mark AM2 may be effectively aligned with each other by matching the general or overall shape of the first alignment mark AM1 with the general or overall shape of the second alignment mark AM2. Accordingly, the display panel 100 and the first film 300 may be aligned with each other using the first alignment mark AM1 and the second alignment mark AM2. In one embodiment, for example, the general shape of each of the first alignment mark AM1 and the second alignment mark AM2 may include an inverted T-like shape when viewed from the top plan view, and the first alignment mark AM1 and the second alignment mark AM2 may be aligned with each other by matching the shapes and placing the first alignment mark AM1 and the second alignment mark AM2 within an error margin.

In an embodiment, by aligning the first to fourth test electrodes AMD11, AMD12, AMD13 and AMD14 of the first alignment mark AM1 with the first to fourth test electrodes AMD21, AMD22, AMD23 and AMD24 of the second alignment mark AM2, respectively, the first alignment mark AM1 and the second alignment mark AM2 may be aligned with each other, and accordingly, the display panel 100 and the first film 300 may be effectively aligned with each other. In one embodiment, for example, by matching the first to fourth test electrodes AMD11, AMD12, AMD13 and AMD14 of the first alignment mark AM1 with the first to fourth test electrodes AMD21, AMD22, AMD23 and AMD24 of the second alignment mark AM2, respectively, and placing the first alignment mark AM1 and the second alignment mark AM2 within an error margin, the first alignment mark AM1 and the second alignment mark AM2 may be aligned with each other.

Hereinafter, a method of manufacturing a display device according to an embodiment will be described in detail with reference to FIGS. 8 and 9.

Figure 8:
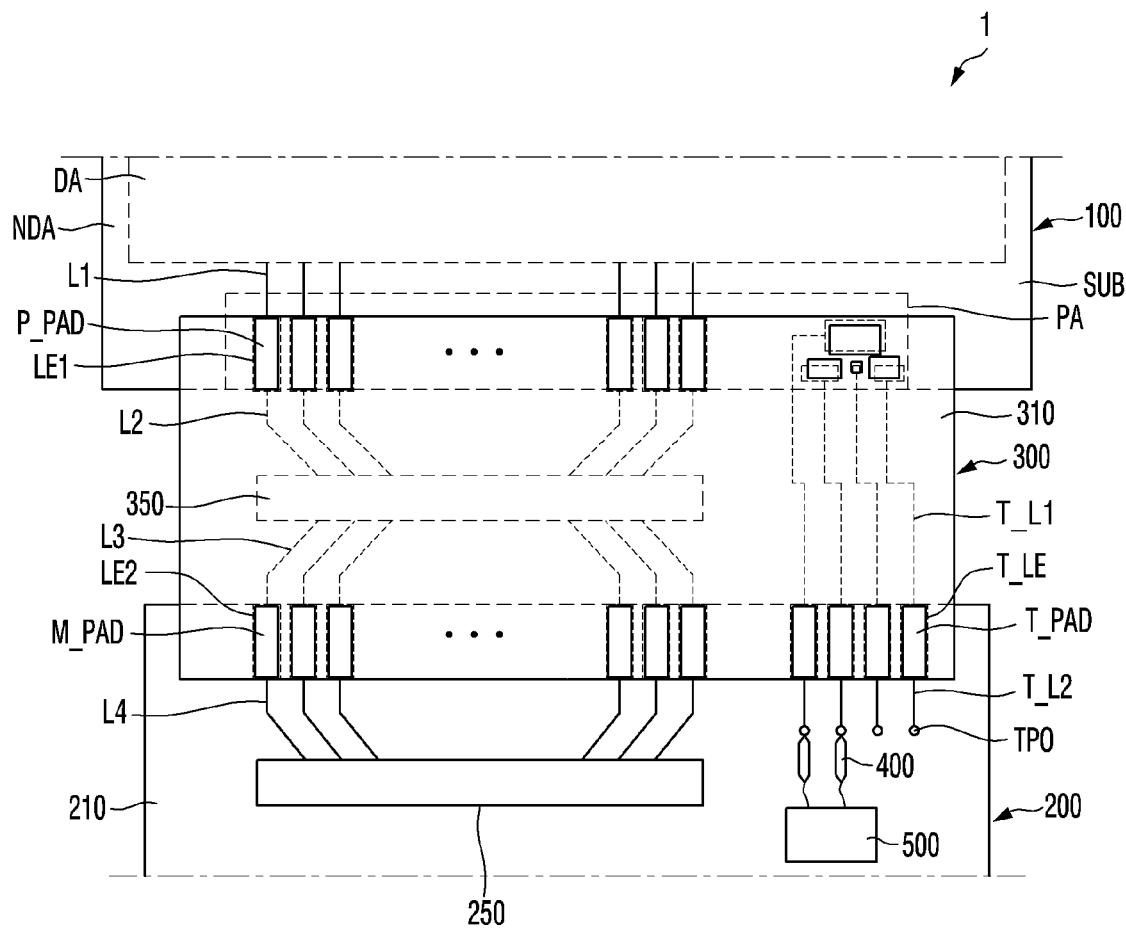
FIG. 8 is a view for illustrating a method of fabricating a display device according to an embodiment of the disclosure.

FIG. 8 is a view for illustrating a method of fabricating a display device according to an embodiment of the disclosure. FIG. 9 is a circuit diagram illustrating a method of measuring insulation resistance. FIG. 8 is a view further illustrating a method of measuring the insulation resistance of the adhesive member ACF of the display device 1.

Figure 7:
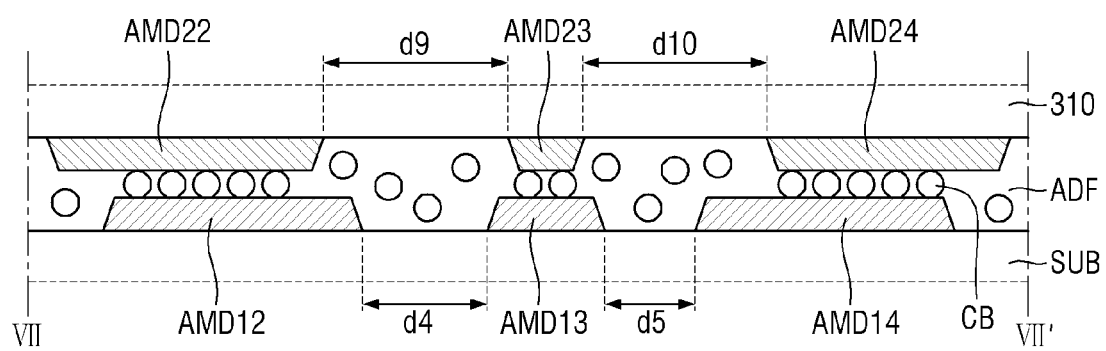
FIG. 7 is a cross-sectional view taken along line VII-VII' of FIG. 5.
Figure 9:
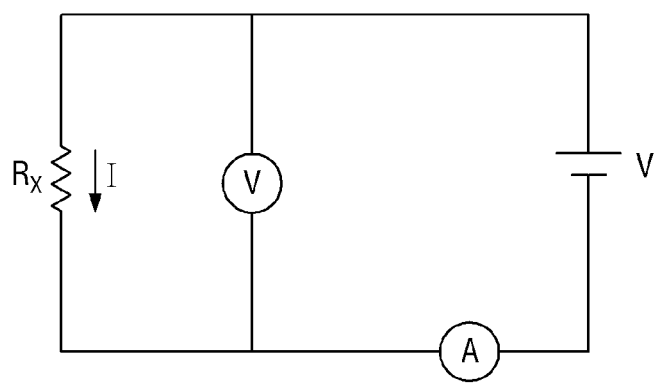
FIG. 9 is a circuit diagram illustrating a method of measuring insulation resistance.

Referring to FIGS. 7, 8 and 9, an embodiment of a method of fabricating the display device 1 may include, prior to measuring the insulation resistance and the insulation gap according to the thickness of the adhesive member ACF, aligning and providing the adhesive member ACF on the display panel 100: aligning the display panel 100, on which the adhesive member ACF is provided, with the first film 300 by using the first alignment mark AM1 and the second alignment mark AM2: attaching the display panel 100 and the first film 300 to each other by the adhesive member ACF: and measuring the insulation resistance and insulation gap of the adhesive member ACF. The processes of the method may be performed in the above-described order, but the disclosure is not limited thereto. Such an order of the processes may be modified or altered.

According to an embodiment of the disclosure, the insulation resistance and insulation gap according to the thickness of the adhesive member ACF of the display device 1 may be measured by jigs 400 and a resistance measuring device 500 connected to the jigs 400. The resistance measuring device 500 may provide a predetermined input voltage to the test points TPO through the jigs 400 and may measure an output voltage and a leakage current. In such a manner, the insulation resistance may be measured.

In an embodiment, the insulation resistance Rx may be directly proportional to the magnitude of the applied voltage V, and may be inversely proportional to the magnitude of the leakage current I, as shown in Equation 1 below:

$$Rx = \frac{V}{I} \qquad \text{[Equation 1]}$$

The voltage V may be applied through one of the two jigs 400 and the leakage current I may be measured through the other of the two jigs 400. Accordingly, the magnitude of the applied voltage V and the magnitude of the leakage current I may be measured, and the insulation resistance Rx may be obtained based thereon.

In one embodiment, for example, when the jigs 400 are in contact with the first test point TPO1 and the second test point TPO2, respectively, the voltage V may be applied through the jig 400 in contact with the first test point TPO1 and the leakage current I may be measured through the jig 400 in contact with the second test point TPO2. Accordingly, the resistance measuring device 500 may calculate the insulation resistance Rx of the insulator, e.g., the adhesive member ACF (see FIG. 7) disposed between the first test electrode AMD11 electrically connected to the first test point TPO1 and the second test electrode AMD12 electrically connected to the second test point TPO2 of the first alignment mark AM1.

In one embodiment, for example, when the jigs 400 are in contact with the first test point TPO1 and the third test point TPO3, respectively, the voltage V may be applied through the jig 400 in contact with the first test point TPO1 and the leakage current I may be measured through the jig 400 in contact with the third test point TPO3. Accordingly, the resistance measuring device 500 may calculate the insulation resistance Rx of the insulator, e.g., the adhesive member ACF (see FIG. 7) disposed between the first test electrode AMD11 electrically connected to the first test point TPO1 and the third test electrode AMD13 electrically connected to the third test point TPO3 of the first alignment mark AM1.

In the same manner as that described above, depending on the test points TPO in contact with the jigs 400, the insulation resistance of the insulator, e.g., the adhesive member ACF (see FIG. 7) disposed between the test electrodes AMD11, AMD12, AMD13 and AMD14 of the first alignment mark AM1 may be measured. The test electrodes AMD11, AMD12, AMD13 and AMD14 of the first alignment mark AM1 are spaced apart from one another by different distances where they face each other, and thus insulation resistances Rx for the different distances may be measured depending on the test points TPO to be in contact with the jigs 400.

In an embodiment, the contact resistance between the jigs 400 and the test points TPO, the resistance of each of the lines, the contact resistance between the leads and the pads, and the contact resistance between the first alignment mark AM1 and the second alignment mark AM2 may be further considered during the process of measuring the insulation resistance Rx.

Hereinafter, alternative embodiments of the disclosure will be described. In such embodiments, the same or similar elements as those described above will be denoted by the same or similar reference numerals, and any repetitive detailed descriptions thereof will be omitted or simplified. Descriptions will be made focusing on differences from the embodiments described above.

Figure 10:
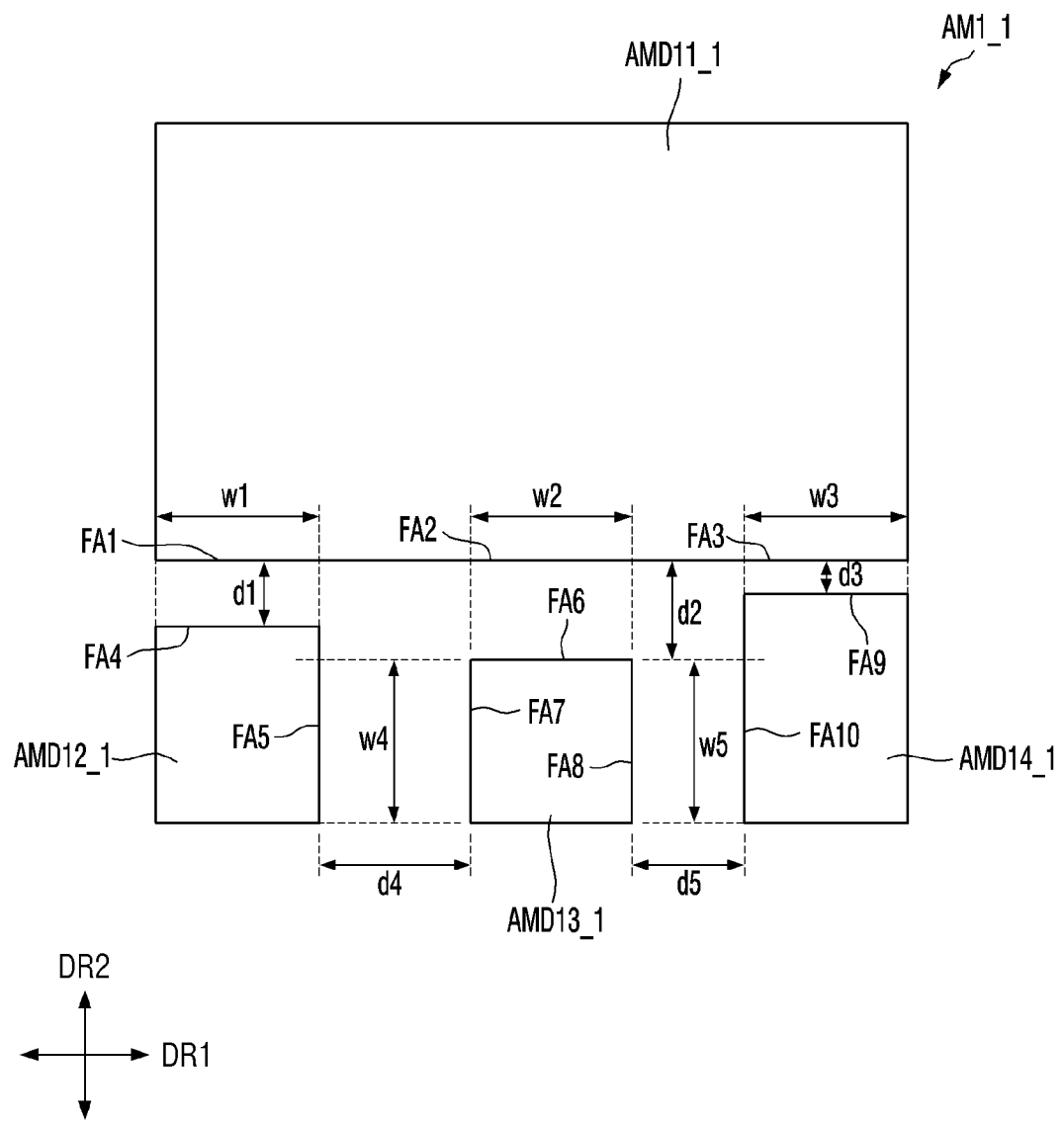
FIG. 10 is a plan view of a first alignment mark according to an alternative embodiment.

FIG. 10 is a plan view of a first alignment mark according to an alternative embodiment.

A first alignment mark AM1_1 of FIG. 10 is different from the first alignment mark AM1 of FIG. 6 in that the former has a different shape from the latter when viewed from the top plan view.

In such an embodiment, the first alignment mark AM1_1 may include first to fourth test electrodes AMD11_1, AMD12_1, AMD13_1 and AMD14_1. A second test electrode AMD12_1 and a fourth test electrode AMD14_1 of the first alignment mark AM1_1 may not protrude relative to a first test electrode AMD11_1 in the first direction DR1.

In such an embodiment, the side surface (left side when viewed from the top plan view) of the second test electrode AMD12_1 in the first direction DR1 may be aligned in the second direction DR2 with the side surface (left side when viewed from the top plan view) of the first test electrode AMD11_1 in the first direction DR1 or may be disposed more to the inside than the side surface of the first test electrode AMD11_1 in the first direction DR1. In such an embodiment, the side surface (right side when viewed from the top plan view) of the fourth test electrode AMD14_1 in the first direction DR1 may be aligned in the second direction DR2 with the side surface (right side when viewed from the top plan view) of the first test electrode AMD11_1 in the first direction DR1 or may be disposed more inwardly than the side surface of the first test electrode AMD11_1 in the first direction DR1.

In such an embodiment, although not shown in the drawings, the second alignment mark AM2 (see FIG. 5) may have a shape generally corresponding to the first alignment mark AM1_1 when viewed from the top plan view. It is, however, to be understood that the disclosure is not limited thereto.

In such an embodiment, the insulation resistance of the adhesive member ACF (see FIG. 7) may be measured through the first alignment mark AM1_1, and the insulation gap may be determined. In such an embodiment, since the first alignment mark AM1_1 may be formed in various patterns, the process may become more convenient, and the reliability may be further improved according to the method of measuring the insulation resistance described above.

Figure 11:
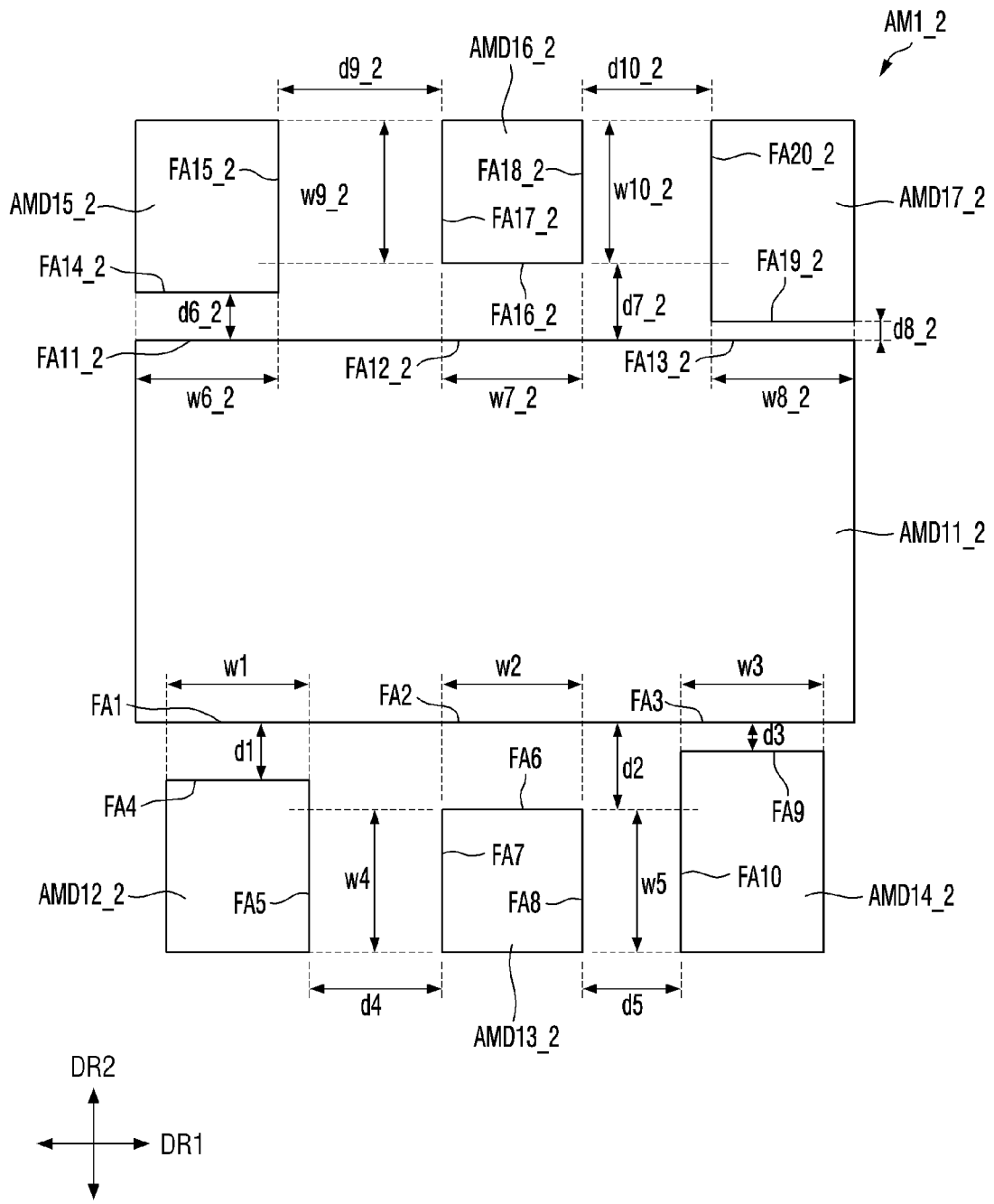
FIG. 11 is a plan view of a first alignment mark according to another alternative embodiment.

FIG. 11 is a plan view of a first alignment mark according to another alternative embodiment.

A first alignment mark AM1_2 of FIG. 11 is different from the first alignment mark AM1_1 of FIG. 10 in that the first alignment mark AM1_2 of FIG. 11 may further include fifth to seventh test electrodes AMD15_2, AMD16_2 and AMD17_2.

In such an embodiment, as shown in FIG. 11, the first alignment mark AM1_2 may further include the fifth to seventh test electrodes AMD15_2, AMD16_2 and AMD17_2, as well as first to fourth test electrodes AMD11_2, AMD12_2, AMD13_2 and AMD14_2. The second to fourth test electrodes AMD12_2, AMD13_2 and AMD14_2 may be disposed at one side of the first test electrode AMD11_2 in the second direction DR2, while the fifth to seventh test electrodes AMD15_2, AMD16_2 and AMD17_2 may be disposed at the opposing side thereof in the second direction DR2. The fifth to seventh test electrodes AMD15_2, AMD16_2 and AMD17_2 may be arranged in the first direction DR1 and may be insulated from one another.

The first test electrode AMD11_2 and the fifth to seventh test electrodes AMD15_2, AMD16_2, and AMD17_2 may face each other at least partially. A second side of the first test electrode AMD11_2 may further include an eleventh facing area FA11_2, a twelfth facing area FA12_2 and a thirteenth facing area FA13_2, which face the fifth to seventh test electrodes AMD15_2, AMD16_2 and AMD17_2, respectively.

The fifth test electrode AMD15_2 may include a fourteenth facing area FA14_2 facing the first test electrode AMD11_2, and a fifteenth facing area FA15_2 facing the sixth test electrode AMD16_2.

The sixth test electrode AMD16_2 may include a sixteenth facing area FA16_2 facing the first test electrode AMD11_2, a seventeenth facing area FA17_2 facing the fifth test electrode AMD15_2, and an eighteenth facing area FA18_2 facing the seventh test electrode AMD17_2.

The seventh test electrode AMD17_2 may include a nineteenth facing area FA19_2 facing the first test electrode AMD11_2, and a twentieth facing area FA20_2 facing the sixth test electrode AMD16_2.

The facing areas FA11_2, FA12_2 and FA13_2 of the first test electrode AMD11_2 may include sixth width w6_2, seventh width w7_2, eighth width w8_2, respectively, and the facing areas FA14_2, FA15_2, FA16_2, FA17_2, FA18_2, FA19_2 and FA20_2 of the fifth to seventh test electrodes AMD15_2, AMD16_2 and AMD17_2 may include the sixth width w6_2, ninth width w9_2, the seventh width w7_2, the ninth width w9_2, tenth width w10_2, the eighth width w8_2, and the tenth width w10_2, respectively. The sixth to tenth widths w6_2, w7_2, w8_2, w9_2 and w10_2 may be substantially equal to the first to fifth widths w1, w2, w3, w4 and w5, respectively.

The facing areas FA11_2, FA12_2 and FA13_2 of the first test electrode AMD11_2, and the facing areas FA14_2, FA15_2, FA16_2, FA17_2, FA18_2, FA19_2 and FA20_2 of the fifth to seventh test electrodes AMD15_2, AMD16_2 and AMD17_2 may be spaced apart from one another by the sixth to tenth distances d6_2, d7_2, d8_2, d9_2 and d10_2. The sixth to tenth distances d6_2, d7_2, d8_2, d9_2 and d10_2 may be different from one another, and may be different from the distances d1, d2, d3, d4 and d5 between the facing areas FA1, FA2, FA3, FA4, FA5, FA6, FA7, FA8, FA9 and FA10.

In such an embodiment, although not shown in the drawings, the second alignment mark AM2 (see FIG. 5) may have a shape generally corresponding to the first alignment mark AM1_2 when viewed from the top plan view. It is, however, to be understood that the disclosure is not limited thereto. In one embodiment, for example, the second alignment mark AM2 (see FIG. 5) may further include fifth to seventh test electrodes, like the first alignment mark AM1_2. The number of the test points TPO (see FIG. 4), the number of the test pads T_PAD (see FIG. 4), the number of the test leads T_LE (see FIG. 4), etc. may correspond to the number of the test electrodes AMD11_2, AMD12_2, AMD13_2, AMD14_2, AMD15_2, AMD16_2 and AMD17_2 of the first alignment mark AM1_2. In one embodiment, for example, the number of the test points TPO (see FIG. 4), the number of the test pads T_PAD (see FIG. 4), the number of the test leads T_LE (see FIG. 4), etc. may be equal to the number of the test electrodes AMD11_2, AMD12_2, AMD13_2, AMD14_2, AMD15_2, AMD16_2 and AMD17_2 of the first alignment mark AM1_2.

In such an embodiment, the insulation resistance of the adhesive member ACF (see FIG. 7) may be measured through the first alignment mark AM1_2, and the insulation spacing may be determined. In such an embodiment, as the first alignment mark AM1_2 further includes the fifth to seventh test electrodes AMD15_2, AMD16_2 and AMD17_2, insulation resistance may be measured more precisely.

Figure 12:
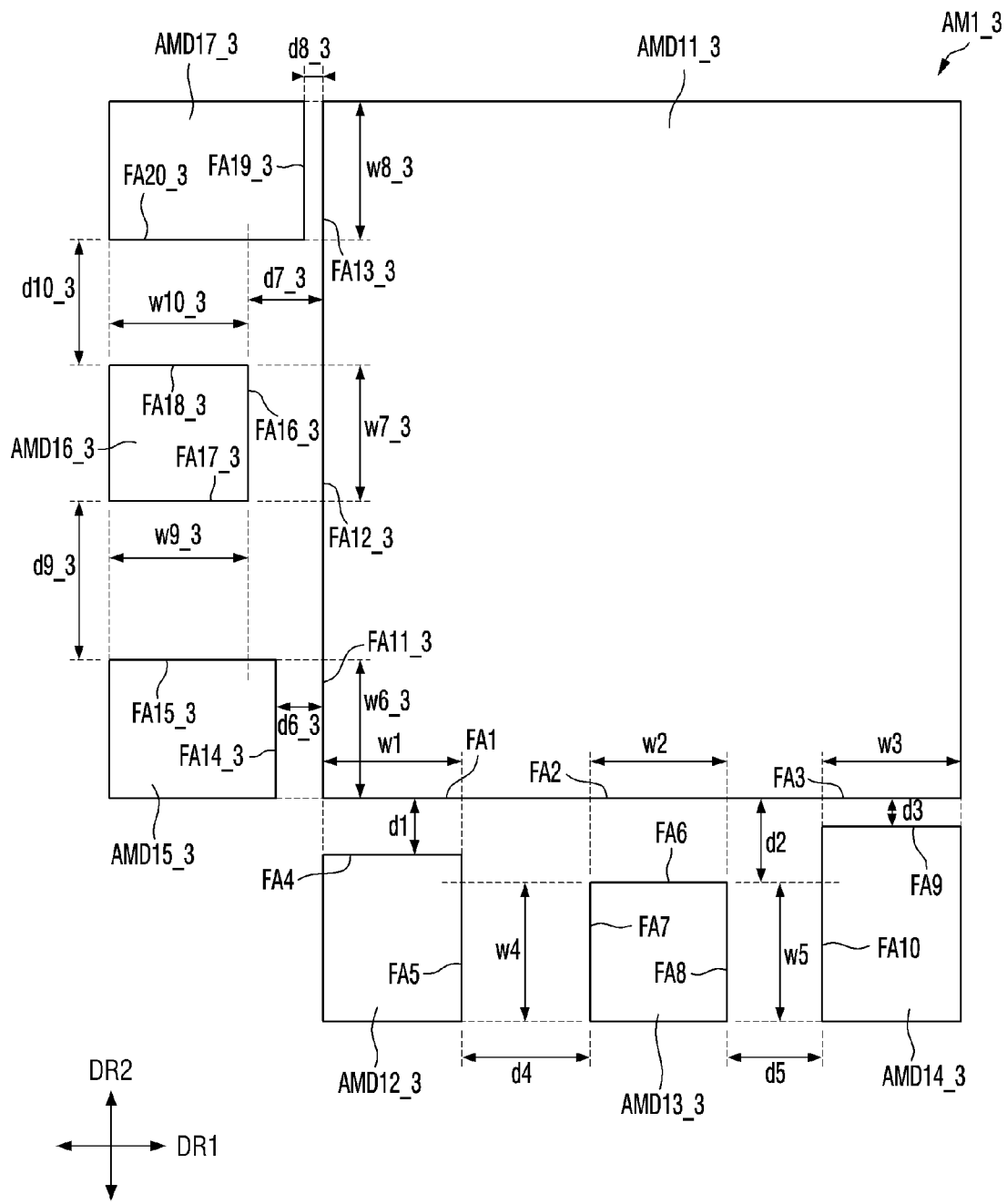
FIG. 12 is a plan view of a first alignment mark according to yet another alternative embodiment.

FIG. 12 is a plan view of a first alignment mark according to yet another alternative embodiment.

The embodiment of FIG. 12 is different from the embodiment of FIG. 11 in that the fifth to seventh test electrodes AMD15_3, AMD16_3 and AMD17_3 of the first alignment mark AM1_3 are disposed at one side of the first test electrode AMD11_3 in the first direction DR1. In such an embodiment, the first to seventh test electrodes AMD11_3 to AMD17_3, facing areas FA1 to FA20_3, the distances d1 to d10_3 and widths w1 to w10_3 therebetween are substantially the same as those described above with reference to FIG. 11, and any repetitive detailed description thereof will be omitted.

In such an embodiment, the insulation resistance of the adhesive member ACF (see FIG. 7) may be measured through the first alignment mark AM1_3, and the insulation spacing may be determined. In such an embodiment, since the first alignment mark AM1_3 may be formed in various patterns, the process may become more convenient, and the reliability may be further improved according to the method of measuring the insulation resistance described above.

Figure 13:
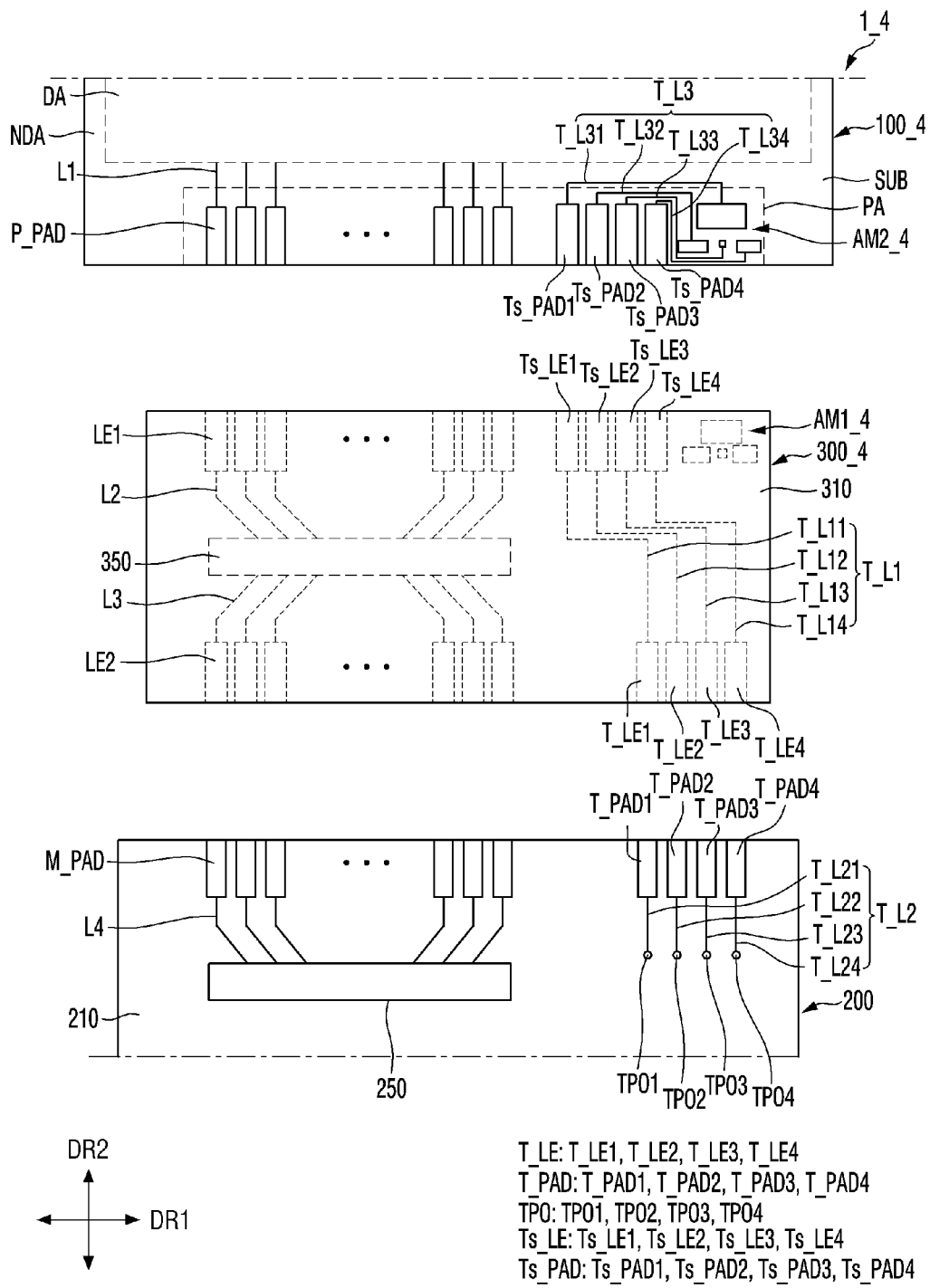
FIG. 13 is a view showing a display panel, a first film and a second film of a display device, which are separated from one another, according to an alternative embodiment.

FIG. 13 is a view showing a display panel, a first film and a second film of a display device, which are separated from one another, according to an alternative embodiment. FIG. 13 shows the periphery of the pad area PA of the display panel 100_4.

A display device 1_4 of FIG. 13 is different from the embodiment of FIG. 4 in that a second alignment mark AM2_4 is disposed on a substrate SUB of the display panel 100_4, and a first alignment mark AM1_4 is disposed on a first film substrate 310 of a first film 300_4.

In such an embodiment, as shown in FIG. 13, the first alignment mark AM1_4 may be disposed on the first film substrate 310_4 of the first film 300, while the second alignment mark AM2_4 may be disposed on the substrate SUB of the display panel 100_4.

The first film 300_4 may further include subsidiary test leads Ts_LE: Ts_LE1, Ts_LE2, Ts_LE3, and Ts_LE4. The subsidiary test leads Ts_LE: Ts_LE1, Ts_LE2, Ts_LE3 and Ts_LE4 may be disposed on the first film substrate 310 of the first film 300_4. The subsidiary test leads Ts_LE: Ts_LE1, Ts_LE2, Ts_LE3 and Ts_LE4 of the first film 300_4 may be physically and/or electrically connected to the first to fourth test leads T_LE1, T_LE2, T_LE3 and T_LE4 of the test leads T_LE through the first test lines T_L1: T_L11, T_L12, T_L13 and T_L14, respectively.

The display panel 100_4 may further include subsidiary test pads Ts_PAD:Ts_PAD1, Ts_PAD2, Ts_PAD3 and Ts_PAD4. When the display panel 100_4 is attached to the first film 300_4, the subsidiary test pads Ts_PAD: Ts_PAD1, Ts_PAD2, Ts_PAD3 and Ts_PAD4 of the display panel 100_4 may overlap and may be physically and/or electrically connected to the subsidiary test leads Ts_LE: Ts_LE1, Ts_LE2, Ts_LE3 and Ts_LE4 of the first film 300_4, respectively.

The subsidiary test pads Ts_PAD:Ts_PAD1, Ts_PAD2, Ts_PAD3 and Ts_PAD4 may be physically and/or electrically connected to the second alignment mark AM2_4 through the third test lines T_L3:T_L31, T_L32, T_L33 and T_L34. Therefore, when the display panel 100_4, the first film 300_4 and the second film 200 are attached to each other, the test points TPO of the second film 200 may be electrically connected to the second alignment mark AM2_4 disposed on the substrate SUB of the display panel 100_4.

In such an embodiment, the insulation resistance of the adhesive member ACF (see FIG. 7) may be measured through the first alignment mark AM1_4, and the insulation spacing may be determined. In such an embodiment, since the first alignment mark AM1_4 and the second alignment mark AM2_4 may be disposed at different locations, the process may become more convenient, and the reliability may be further improved according to the method of measuring the insulation resistance described above.

Figure 14:
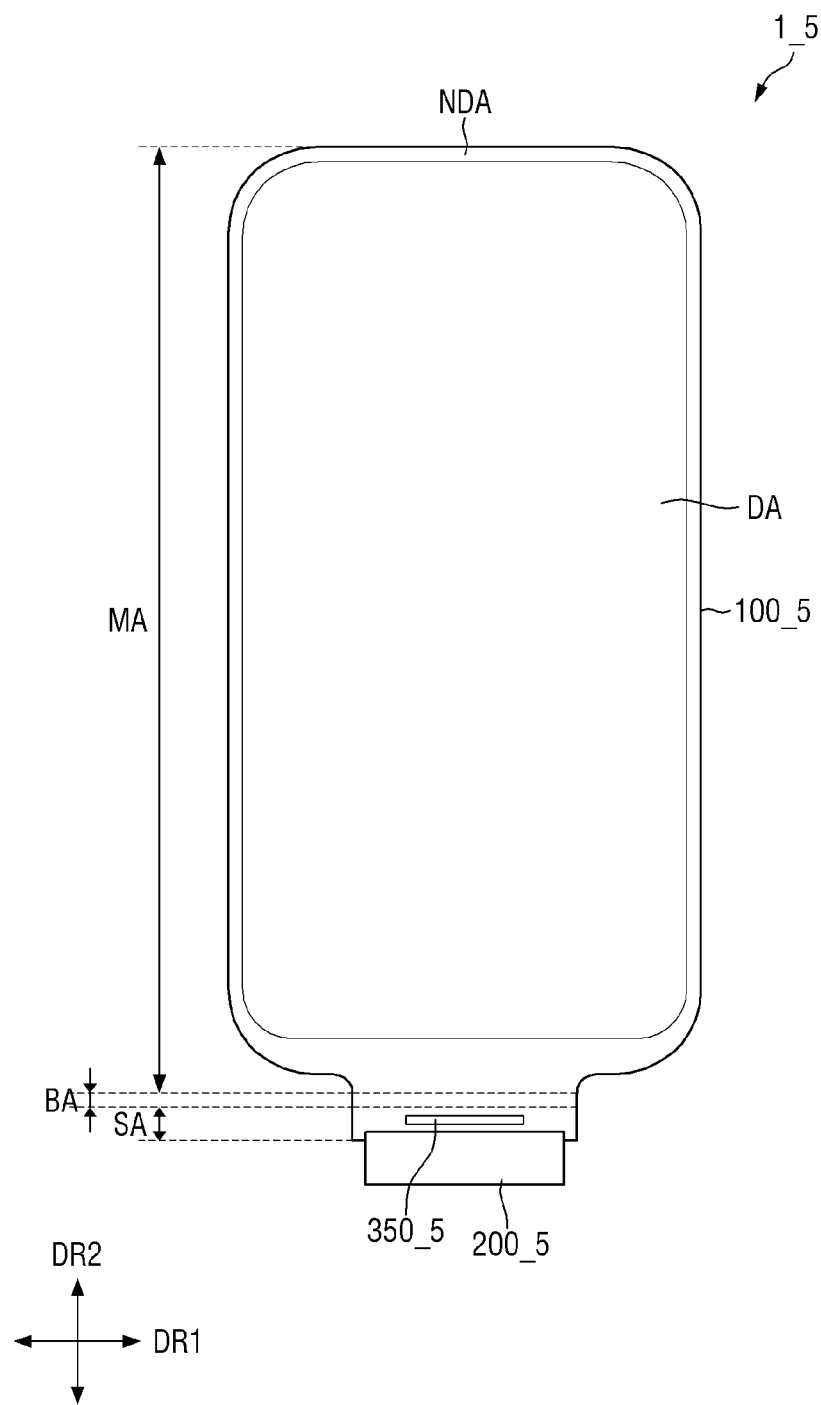
FIG. 14 is a plan view of a display device according to an alternative embodiment of the disclosure.
Figure 15:
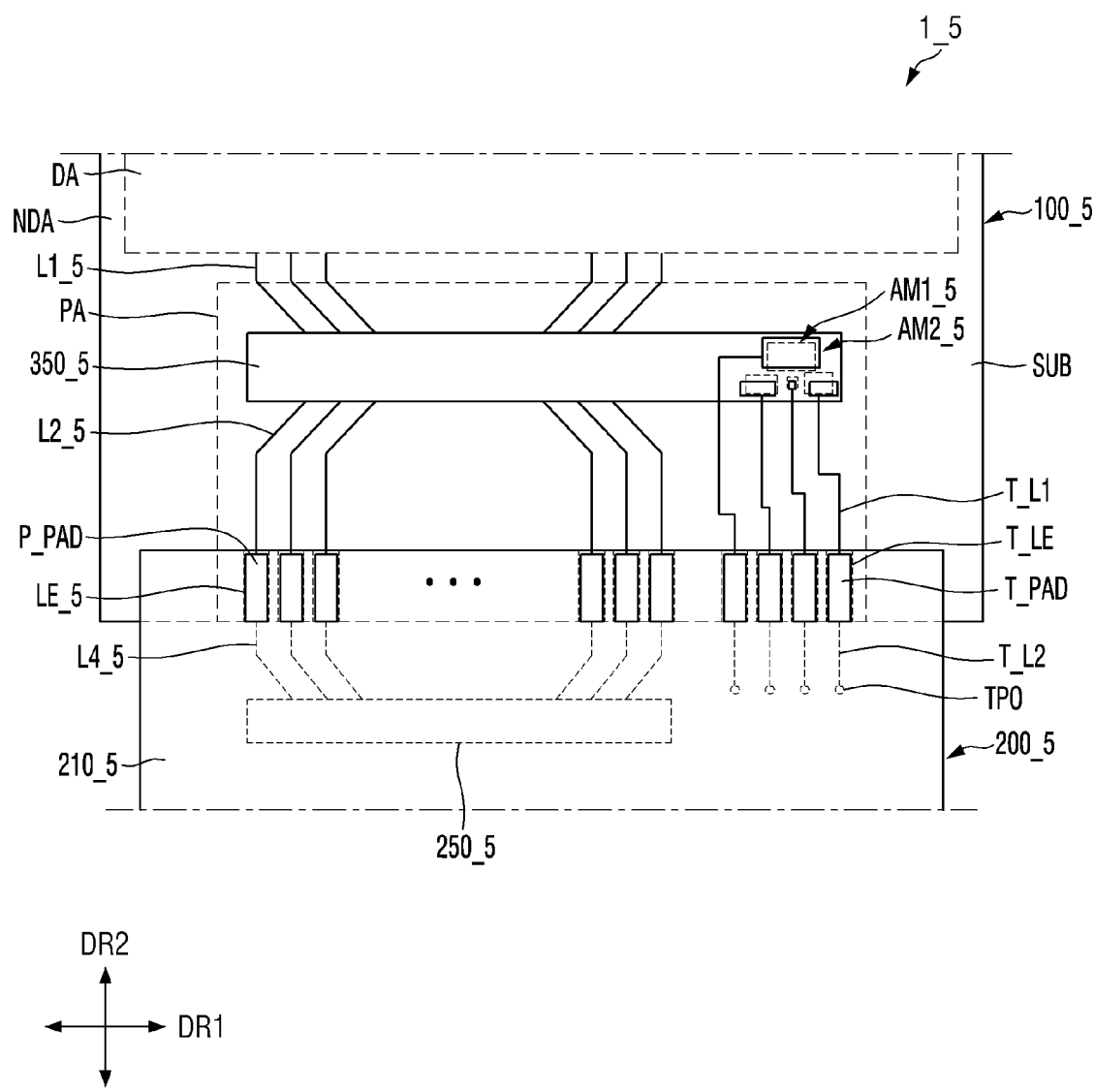
FIG. 15 is a view showing a display panel and a second film of a display device, which are coupled with each other, according to an alternative embodiment.
Figure 16:
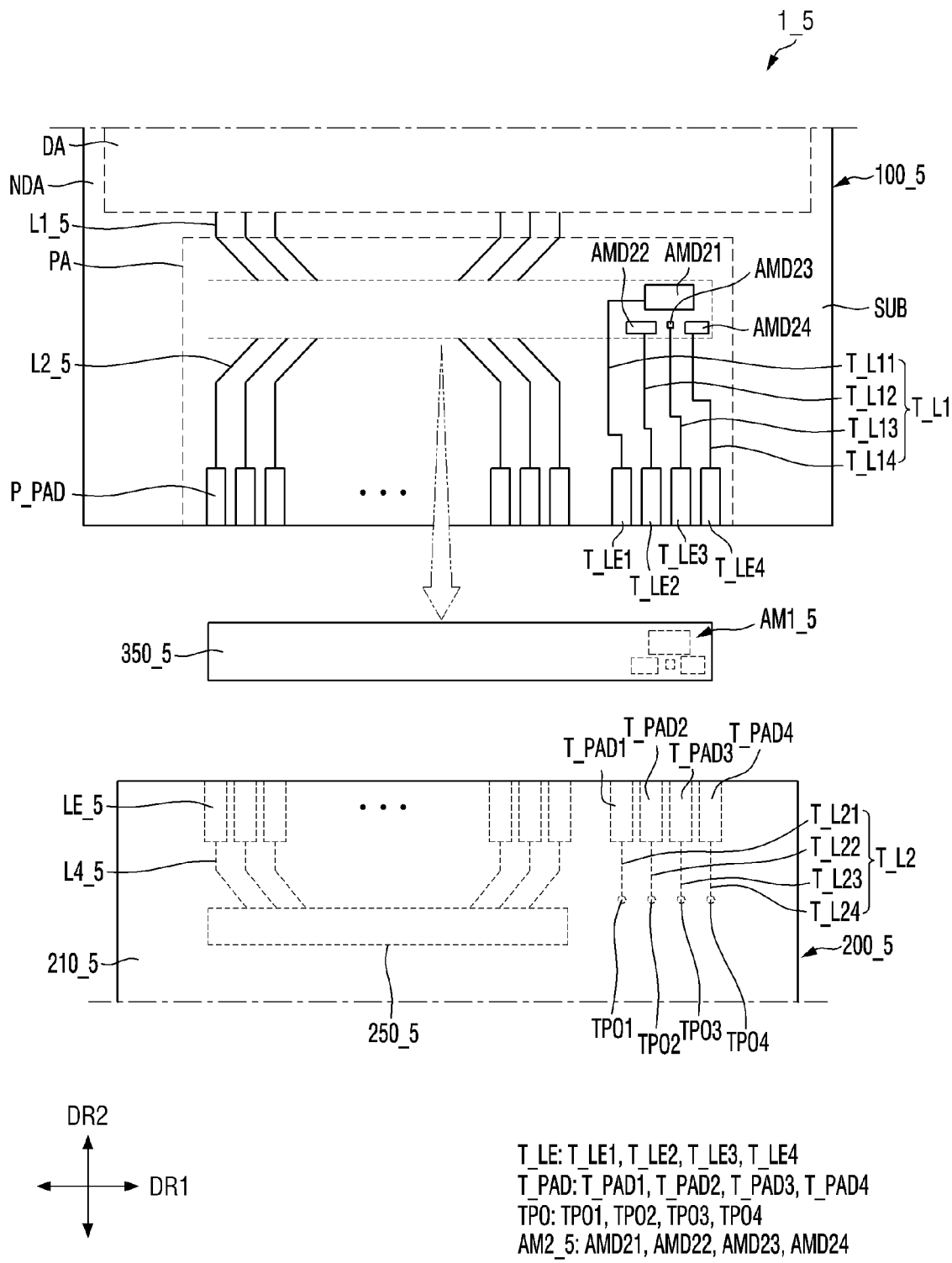
FIG. 16 is a view showing the display panel and the second film of FIG. 15, which are separated from each other.

FIG. 14 is a plan view of a display device according to an alternative embodiment of the disclosure. FIG. 15 is a view showing a display panel and a second film of a display device, which are coupled with each other, according an alternative embodiment. FIG. 16 is a view showing the display panel and the second film of FIG. 15, which are separated from each other. FIGS. 15 and 16 show the periphery of the pad area PA of the display panel 100_5.

An embodiment of a display device 1_5 of FIGS. 14 to 16 is different from the embodiment of FIG. 4 in that the display device 1_5 does not include the first film 300 (see FIG. 4).

In such an embodiment, the display panel 100_5 may be a flexible display panel. In such an embodiment, the substrate SUB of the display panel 100_5 may be a flexible substrate. The display panel 100_5 may include a main area MA and a bending area BA connected to one side of the main area MA in the second direction DR2. The display panel 100_5 may further include a subsidiary area SA connected to the bending area BA at a side facing the one side of the main area MA in the second direction DR2.

The display area DA may be located in the main area MA. The non-display area NDA may be located at the peripheral edge of the display area DA in the main area MA.

The bending area BA may be connected through one shorter side of the main area MA with the main area MA. In the bending area BA, the display panel 100_5 may be bent with a curvature toward the opposite side of the display surface. As the display panel 100_5 is bent at the bending area BA, the surface of the display panel 100_5 may be inverted. In an embodiment, the surface of the display panel 100_5 facing upward may be bent such that the surface of the display panel 100_5 faces outward at the bending area BA and then faces downward.

The subsidiary area SA may extend from the bending area BA. When the display panel 100_5 is bent at the bending area BA, the subsidiary area SA may be parallel to the main area MA and may extend from the bending area BA in substantially a reverse direction as an extending direction of the main area MA from the bending area BA. The pad area PA may be located on the subsidiary area SA of the display panel 100_5.

In such an embodiment, as shown in FIG. 15, a driving chip 350_5, panel pads P_PAD and test leads T_LE may be disposed in the pad area PA of the display panel 100_5. The driving chip 350_5 may be physically and/or electrically connected to the pixels in the display area DA through first signal lines L1_5. The driving chip 350_5 may be physically and/or electrically connected to the panel pads P_PAD through second signal lines L2_5.

The driving chip 350_5 may be mounted on a surface of the display panel 100_5. The driving chip 350_5 may include, for example, an integrated circuit that drives the display panel 100_5, and may be implemented as a display panel driving chip by employing the chip on plastic ("COP") technique.

The driving chip 350_5 may further include a first alignment mark AM1_5, and the display panel 100_5 may further include a second alignment mark AM2_5. The first alignment mark AM1_5 may be disposed on the rear surface of the driving chip 350_5, and the second alignment mark AM2_5 may be disposed on the front surface of the substrate SUB of the display panel 100_5. When the driving chip 350_5 is attached on the substrate SUB of the display panel 100_5, the first alignment mark AM1_5 and the second alignment mark AM2_5 may face each other.

The test electrodes AMD21, AMD22, AMD23 and AMD24 of the second alignment mark AM2_5 may be physically and/or electrically connected to the test leads T_LE:T_LE1, T_LE2, T_LE3 and T_LE4 through the first test lines T_L1:T_L11, T_L12, T_L13 and T_L14.

The second film 200_5 may include a main circuitry 250_5, connection leads LE_5, test pads T_PAD:T_PAD1, T_PAD2, T_PAD3 and T_PAD4, and test points TPO. The main circuitry 250_5, the connection leads LE_5, the test pads T_PAD: T_PAD1, T_PAD2, T_PAD3 and T_PAD4, and the test point TPO may be disposed on the rear surface of a second film 200_5. It is, however, to be understood that the disclosure is not limited thereto.

The main circuitry 250_5 may be physically and/or electrically connected to the connection leads LE_5 through fourth signal lines L4_5. The test points TPO may be physically and/or electrically connected to the test pads T_PAD through the second test lines T_L2: T_L21, T_L22, T_L23 and T_L24.

In an embodiment, the second film 200_5 may be directly attached to the display panel 100_5. In such an embodiment, the panel pads P_PAD of the display panel 100_5 may be physically and/or electrically connected to the connection leads LE_5 of the second film 200_5. The test leads T_LE of the display panel 100_5 may be physically and/or electrically connected to the test pads T_PAD of the second film 200_5. Accordingly, the test points TPO may be electrically connected to the second alignment mark AM2_5.

In such an embodiment, the insulation resistance of the adhesive member ACF (see FIG. 7) may be measured through the first alignment mark AM1_5, and the insulation gap may be determined. In such an embodiment, where the first film 300 (see FIG. 4) is omitted, the insulation resistance may be measured and the insulation gap may be determined. Accordingly, the process may become more convenient, and reliability may be further improved according to the method of measuring insulation resistance described above.

Figure 17:
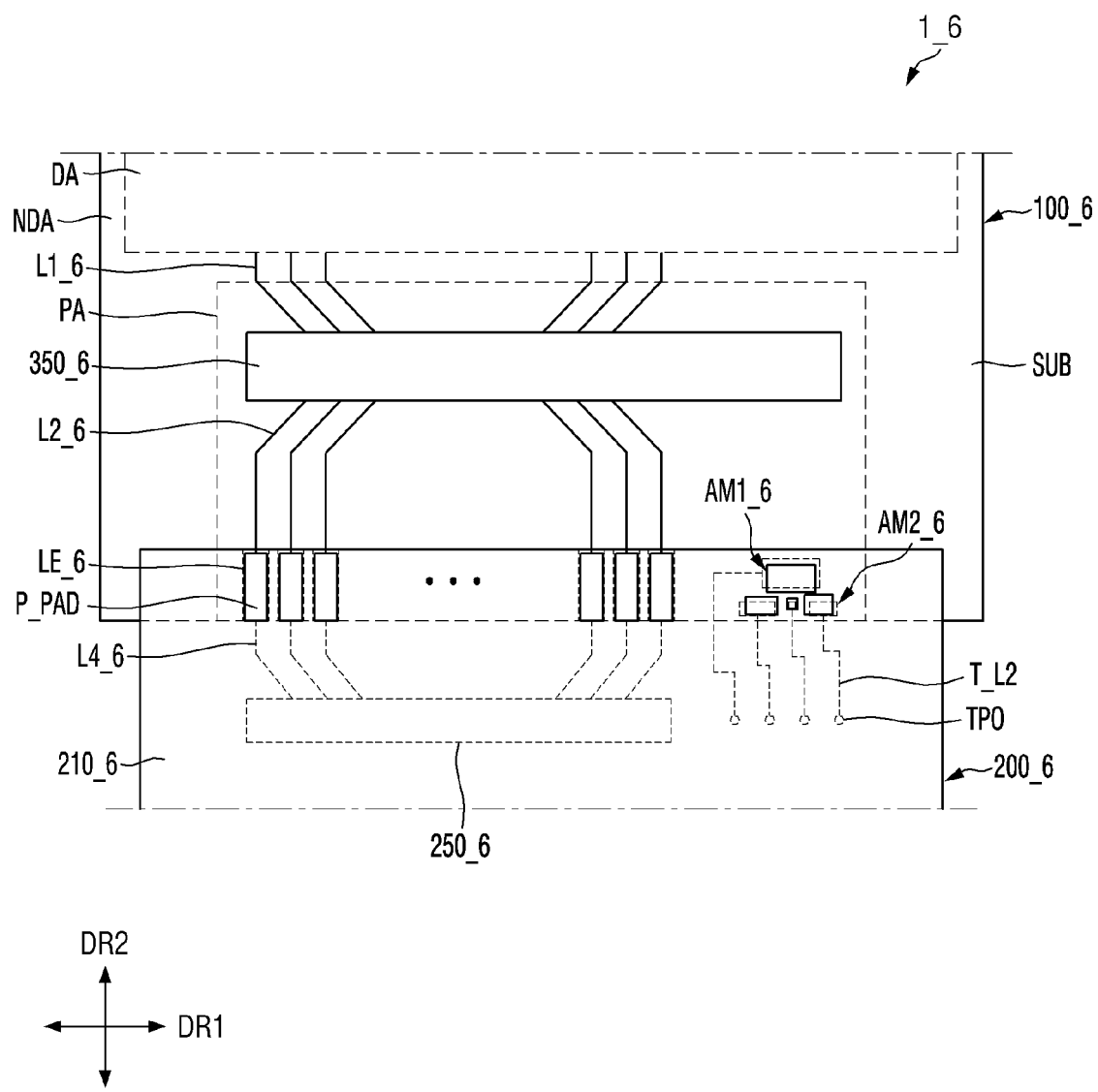
FIG. 17 is a view showing a display panel and a second film of a display device, which are coupled with each other, according to another alternative embodiment.
Figure 18:
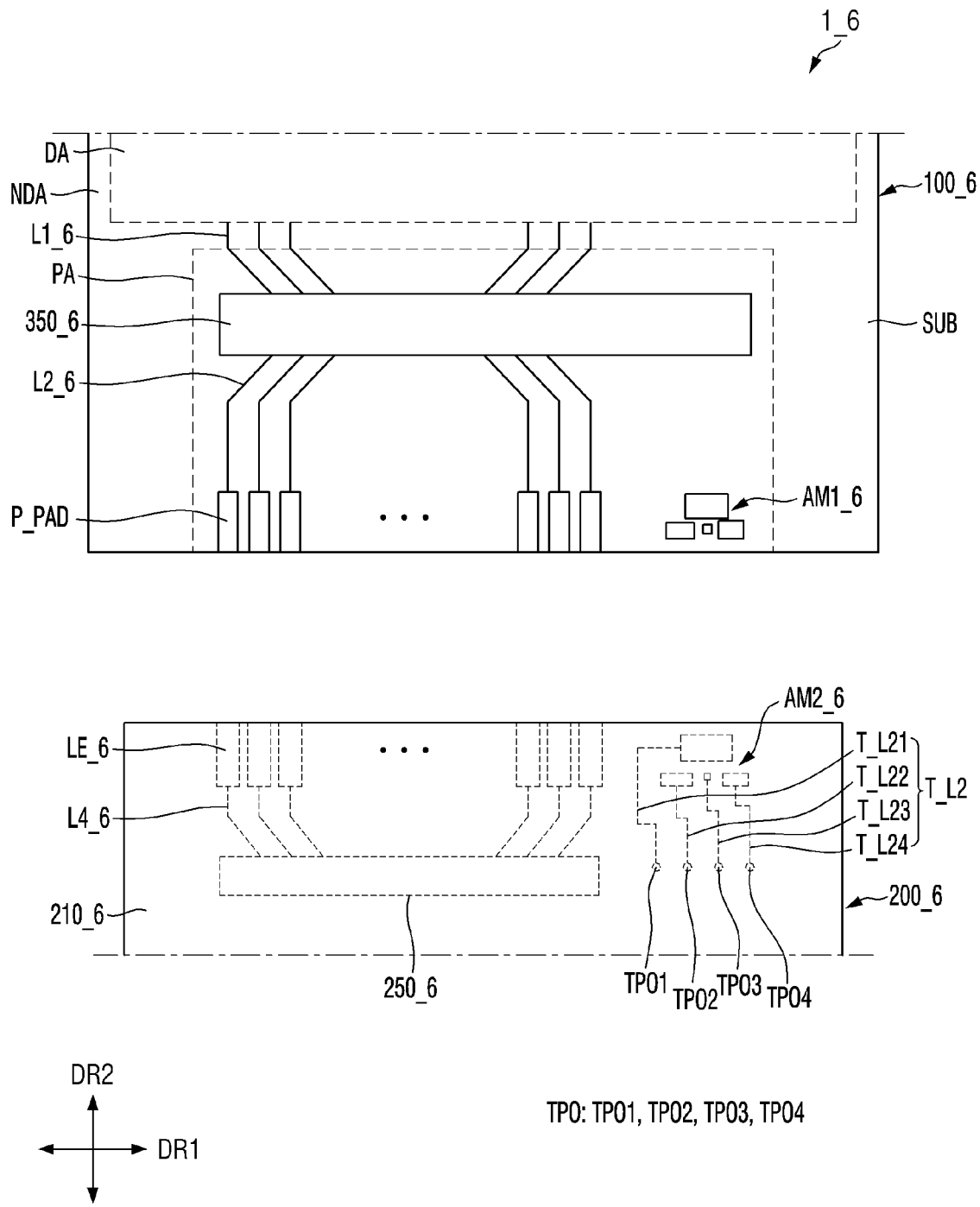
FIG. 18 is a view showing the display panel and the second film of FIG. 17, which are separated from each other.

FIG. 17 is a view showing a display panel and a second film of a display device, which are coupled with each other, according to another alternative embodiment. FIG. 18 is a view showing the display panel and the second film of FIG. 17, which are separated from each other. FIGS. 17 and 18 show the periphery of the pad area PA of the display panel 100_6.

The embodiment of FIGS. 17 and 18 is different from the embodiment of FIGS. 14 to 16 in that a first alignment mark AM1_6 and a second alignment mark AM2_6 of a display device 1_6 are disposed where a display panel 100_6 and a second film 200_6 overlap each other.

In such an embodiment, as shown in FIG. 17, the first alignment mark AM1_6 may be disposed on the front surface of the display panel 100_6, while the second alignment mark AM2_6 may be disposed on the rear surface of the second film 200_6. The second alignment mark AM2_6 may be physically and/or electrically connected to the test points TPO: TPO1, TPO2, TPO3 and TPO4 through the second test lines T_L2:T_L21, T_L22, T_L23 and T_L24. In such an embodiment, other elements, e.g., the driving chip 350_6, the first signal lines L1_6, the second signal lines L2_6, the connection leads LE_6, the fourth signal lines L4_6, the second film 200_6, and the main circuitry 250_6, are substantially the same as those described above, and any repetitive detailed description thereof will be omitted.

In such an embodiment, the insulation resistance of the adhesive member ACF (see FIG. 7) may be measured through the first alignment mark AM1_6, and the insulation spacing may be determined. In such an embodiment, where the first film 300 (see FIG. 4) is omitted, the insulation resistance may be measured and the insulation gap may be determined as described above. Accordingly, the process may become more convenient, and reliability may be further improved according to the method of measuring insulation resistance described above.

Figure 19:
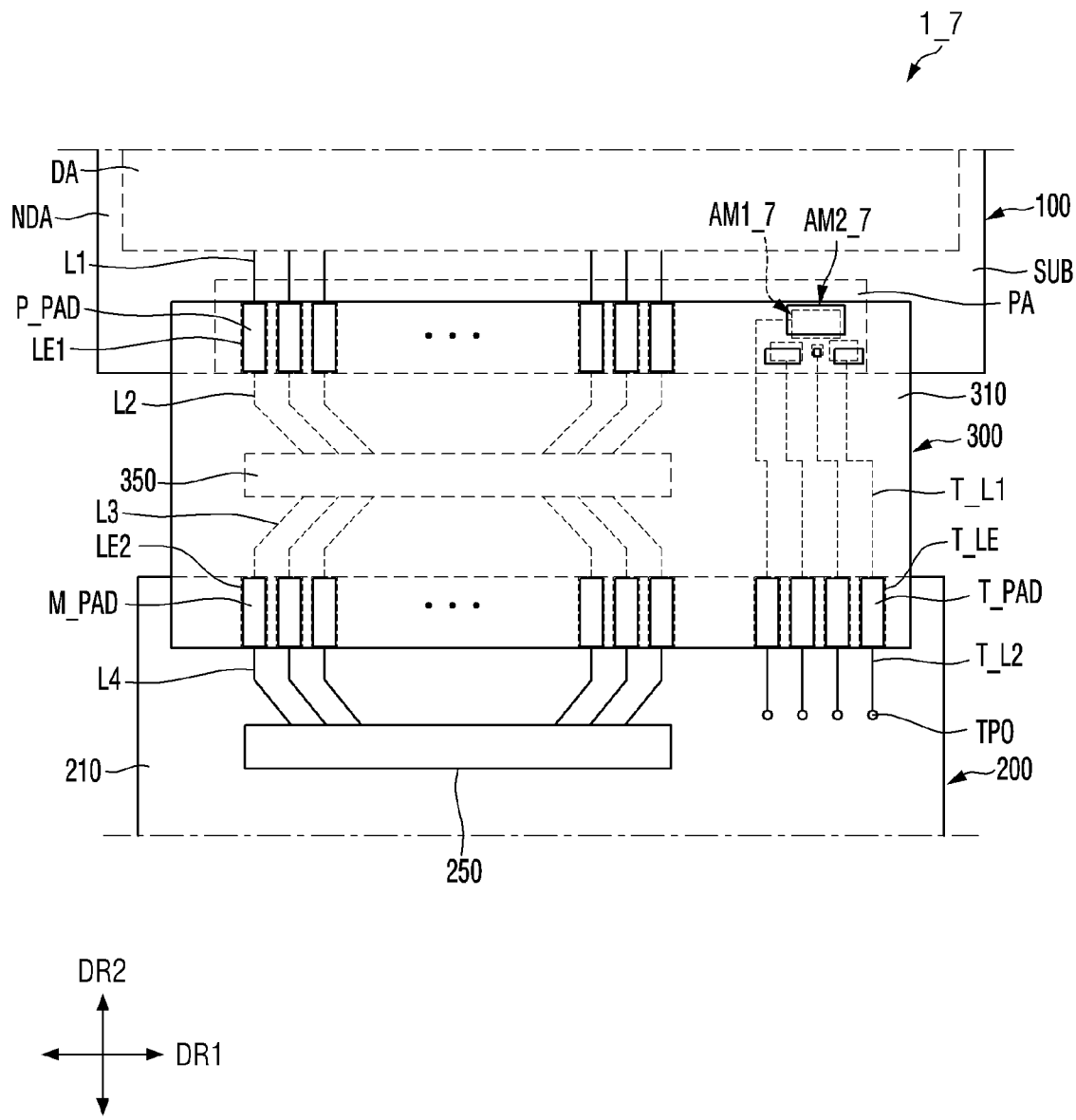
FIG. 19 is a schematic plan view showing a layout of a display panel, a first film and a second film of a display device according to yet another alternative embodiment.
Figure 20:
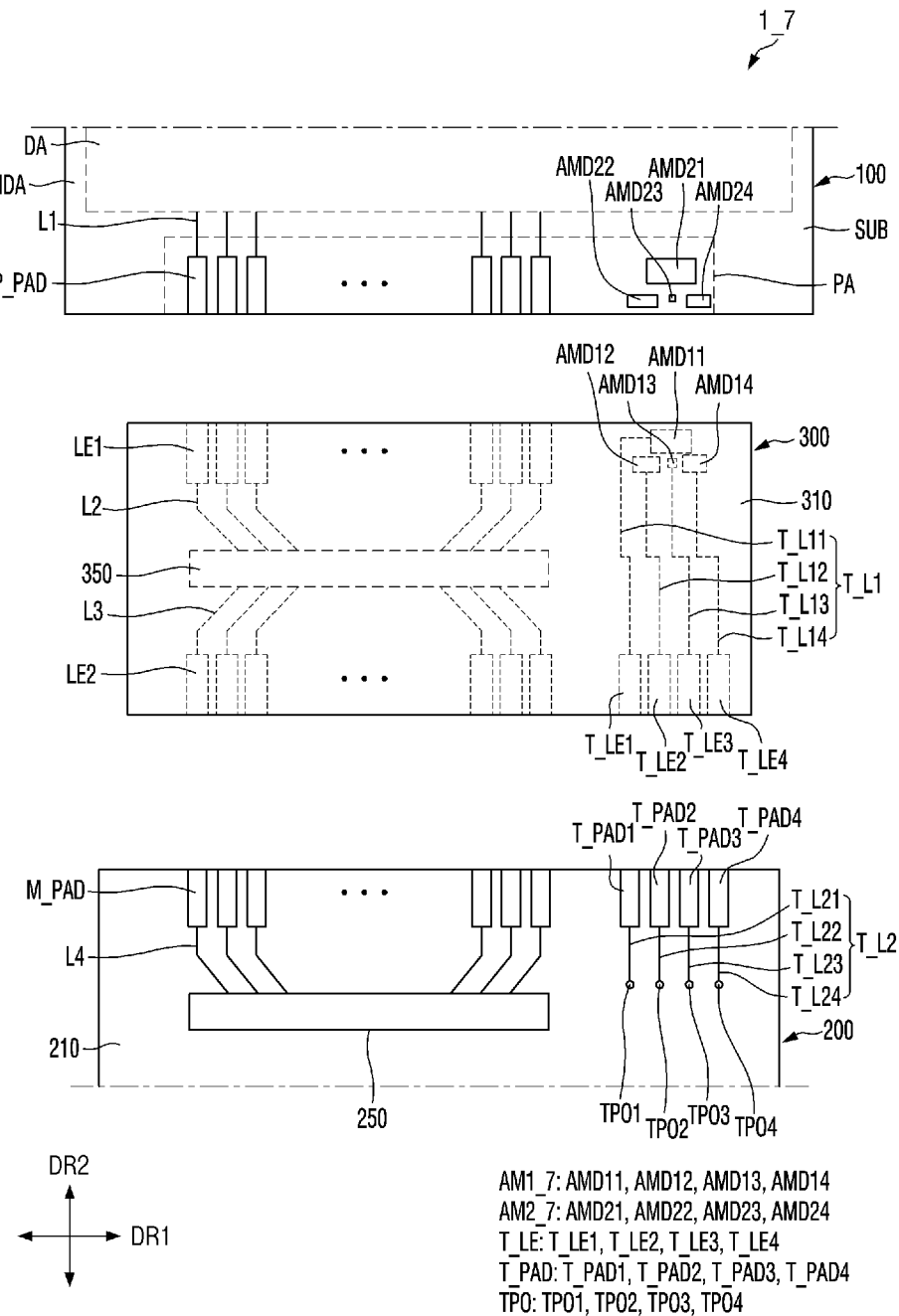
FIG. 20 is a view showing the display panel, the first film and the second film of FIG. 19, which are separated from one another.

FIG. 19 is a schematic plan view showing a layout of a display panel, a first film and a second film of a display device according to yet another alternative embodiment. FIG. 20 is a view showing the display panel, the first film and the second film of FIG. 19, which are separated from one another.

The embodiment of FIGS. 19 and 20 is different from the embodiment of FIGS. 3 and 4 in that a first alignment mark AM1_7 of a display device 1_7 is directly connected to first test lines T_L1:T_L11, T_L12, T_L13 and T_L14.

In such an embodiment, as shown in FIGS. 19 and 20, the first alignment mark AM1_7 may be disposed on the first film substrate 310 of the first film 300, while the second alignment mark AM2_7 may be disposed on the substrate SUB of the display panel 100. The first to fourth test electrodes AMD11, AMD12, AMD13 and AMD14 of the first alignment mark AM1_7 may be directly connected to the first test lines T_L1:T_L11, T_L12, T_L13 and T_L14, respectively. In such an embodiment, the first to fourth test electrodes AMD21, AMD22, AMD23 and AMD24 of the second alignment mark AM2_7 may be electrically connected to the first test lines T_L1:T_L11, T_L12, T_L13 and T_L14 through the first to fourth test electrodes AMD11, AMD12, AMD13 and AMD14 of the first alignment mark AM1_7, respectively.

In such an embodiment, the insulation resistance of the adhesive member ACF (see FIG. 7) may be measured through the first alignment mark AM1_7, and the insulation spacing may be determined. In such an embodiment, since the first to fourth test electrodes AMD11, AMD12, AMD13 and AMD14 of the first alignment mark AM1_7 are directly connected to the first test lines T_L1:T_L11, T_L12, T_L13 and T_L14 without passing through the second alignment mark AM2_7, the reliability of the measured insulation resistance may be further improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, wherein the display device comprising:
    a display panel;
    a first film attached to the display panel;
    an adhesive member interposed between the display panel and the first film and extending in a first direction to attach the display panel to the first film;
    a first test electrode covered by the adhesive member;
    a second test electrode covered by the adhesive member and spaced apart from the first test electrode in a second direction perpendicular to the first direction; and
    test lines comprising a first test line electrically connected to the first test electrode and a second test line electrically connected to the second test electrode,
    wherein the adhesive member is disposed between the first test electrode and the second test electrode in the second direction,
    wherein the first test electrode and the second test electrode are electrically disconnected from a display area of the display panel, and
    the first text electrode and the second test electrode are spaced apart from any signal line connected to the display area of the display panel in a plan view.

2. The display device of claim 1, further comprising:
    a third test electrode separated from the first test electrode and the second test electrode,
    wherein the test lines further comprises a third test line electrically connected to the third test electrode,
    wherein
    the first test electrode includes a first facing area facing the second test electrode, the second test electrode includes a second facing area facing the first test electrode and a third facing area facing the third test electrode, and the third test electrode includes a fourth facing area facing the second test electrode, and wherein the first facing area, the second facing area, the third facing area and the fourth facing area have a same width.

3. The display device of claim 2, wherein a first distance between the first and second facing areas is different from a second distance between the third and fourth facing areas.

4. The display device of claim 3, wherein
the first distance is constant between the first facing area and the second facing area, and
the second distance is constant between the third facing area and the fourth facing area.

5. The display device of claim 3, wherein each of the first distance and the second distance is in a range of about 1 μm to about 15 μm.

6. The display device of claim 1, further comprising:
a second film attached to the first film; and
test points disposed on the second film,
wherein the test points comprise a first test point electrically connected to the first test electrode and a second test point electrically connected to the second test electrode.

7. The display device of claim 6, wherein
the first test point is electrically connected to the first test electrode through the first test line, and
the second test point is electrically connected to the second test electrode through the second test line.

8. The display device of claim 1, further comprising:
a driving chip disposed on the display panel; and
test points disposed on the first film,
wherein the test points comprise a first test point electrically connected to the first test electrode, and a second test point electrically connected to the second test electrode, and
wherein the first test point is electrically connected to the first test electrode through the first test line, and the second test point is electrically connected to the second test electrode through the second test line.

9. The display device of claim 1, further comprising:
a fifth test electrode disposed on the first film, overlapped with the first test electrode and electrically connected to the first test electrode, and
a sixth test electrode disposed on the first film, overlapped with the second test electrode and electrically connected to the second test electrode.

10. The display device of claim 9, wherein a distance between the first test electrode and the second test electrode is smaller than a distance between the fifth test electrode and the sixth test electrode.

11. The display device of claim 10, wherein
the first test electrode includes a first side facing the second test electrode,
the second test electrode includes a second side facing the first test electrode,
the fifth test electrode includes a third side facing the sixth test electrode, and
the sixth test electrode includes a fourth side facing the fifth test electrode, wherein the first side protrudes outward than the third side with respect to the first test electrode and the fifth test electrode, and the second side protrudes outward than the fourth side with respect to the second test electrode and the sixth test electrode.

12. The display device of claim 9, wherein the fifth test electrode and the sixth test electrode are spaced apart from each other in the second direction with the adhesive member interposed therebetween.

13. The display device of claim 1, wherein the adhesive member comprises an anisotropic conducting film.

14. A display device, wherein the display device comprising:
a display panel;
a first film attached to the display panel;
a first alignment mark disposed on one of the display panel and the first film; and
a second alignment mark disposed on the other of the display panel and the first film and facing the first alignment mark,
wherein the first alignment mark comprises a first test electrode, a second test electrode and a third test electrode, which are separated from one another,
wherein
the first test electrode of the first alignment mark includes a first facing area facing the second test electrode,
the second test electrode includes a second facing area facing the first test electrode and a third facing area facing the third test electrode, and
the third test electrode includes a fourth facing area facing the second test electrode, and
wherein the first facing area, the second facing area, the third facing area and the fourth facing area have a same width as one another,
wherein the first test electrode, the second test electrode and the third test electrode are electrically disconnected from a display area of the display panel, and
the first test electrode, the second test electrode and the third test electrode are spaced apart from any signal line connected to the display area of the display panel in a plan view.

15. The display device of claim 14, wherein a first distance between the first and second facing areas is different from a second distance between the third and fourth facing areas.

16. The display device of claim 15, wherein
the first distance is constant between the first facing area and the second facing area, and
the second distance is constant between the third facing area and the fourth facing area.

17. The display device of claim 14, further comprising:
test points electrically connected to the first test electrode, the second test electrode and the third test electrode of the first alignment mark, respectively,
wherein an insulation resistance between the first test electrode and the second test electrode and an insulation resistance between the second test electrode and the third test electrode of the first alignment mark are measured through the test points.

* * * * *